(12) United States Patent
Terui et al.

(10) Patent No.: US 7,540,367 B2
(45) Date of Patent: Jun. 2, 2009

(54) TRAY PARTS FEEDER

(75) Inventors: Seiichi Terui, Chiryu (JP); Takehisa Ishikawa, Chiryu (JP)

(73) Assignee: Fuji Machine MFG. Co., Ltd., Chiryu-shi (JP)

( * ) Notice: Subject to any disclaimer, the term of this patent is extended or adjusted under 35 U.S.C. 154(b) by 198 days.

(21) Appl. No.: 10/549,288

(22) PCT Filed: Apr. 5, 2004

(86) PCT No.: PCT/JP2004/004904

§ 371 (c)(1),
(2), (4) Date: Sep. 16, 2005

(87) PCT Pub. No.: WO2004/091273

PCT Pub. Date: Oct. 21, 2004

(65) Prior Publication Data

US 2006/0169412 A1  Aug. 3, 2006

(30) Foreign Application Priority Data

Apr. 4, 2003   (JP)   ............................. 2003-101147

(51) Int. Cl.
*B65G 47/57*  (2006.01)
*B65G 47/56*  (2006.01)

(52) U.S. Cl. .................. 198/347.1; 198/801; 198/347.3; 198/464.2; 198/469.1; 198/817

(58) Field of Classification Search .............. 198/347.1, 198/801, 347.3
See application file for complete search history.

(56) References Cited

U.S. PATENT DOCUMENTS

| 1,969,122 | A | * | 8/1934 | De Witt | ........................ 198/607 |
| 3,944,046 | A | * | 3/1976 | Kubicek | ................... 198/464.2 |
| 5,415,280 | A | * | 5/1995 | Balboni et al. | .............. 198/435 |
| 5,611,422 | A | * | 3/1997 | Harkonen | .................... 198/681 |
| 2005/0006201 | A1 | * | 1/2005 | Spatafora | ................. 198/347.1 |

FOREIGN PATENT DOCUMENTS

| JP | 7-17602 | 1/1995 |
| JP | 8-37396 | 2/1996 |
| JP | 10-233596 | 9/1998 |
| JP | 11-238997 | 8/1999 |

* cited by examiner

*Primary Examiner*—Gene Crawford
*Assistant Examiner*—Kavel P Singh
(74) *Attorney, Agent, or Firm*—Oblon, Spivak, McClelland, Maier & Neustadt, P.C.

(57) ABSTRACT

A tray component supply apparatus comprises a main body side replenishment tray holding section 50 provided at an upper part over a tray stocker 40 of an apparatus main body 30 and a tray discharge section 60 provided at a lower part under the tray stocker 40 of the apparatus main body 30. The tray stocker 40 is provided with a tray stocker side replenishment tray holding section 80 on a top plate 44 thereof and empty tray holding members 85 on a bottom plate 43 thereof.

16 Claims, 23 Drawing Sheets

TRAY PARTS FEEDER

TECHNOLOGICAL FIELD

The present invention relates to a tray component supply apparatus for supplying small components to an electronic component mounting apparatus which mounts small components such as electronic components or the like on circuit boards or the like.

BACKGROUND ART

Heretofore, as tray component supply apparatus, there has been known one which is provided with a main body beside a component mounting apparatus for mounting components on a board transferred thereto, a tray stocker housed in the main body to be movable in the vertical direction, plural component supply trays juxtaposed in the vertical direction within the tray stocker and held to be slidable in the horizontal direction each for storing plural components on an upper surface thereof, a stocker drive device provided in the main body for moving the tray stocker in the vertical direction to position the tray stocker to a predetermined position, a tray mounting table provided to protrude in the horizontal direction from a lateral surface on the component mounting apparatus side of the main body for enabling the component supply tray to be mounted on the upper surface thereof, and a tray drawing mechanism for drawing a component supply tray stored in the tray stocker to a component pickup position on the tray mounting table (refer to Patent Document 1).

At a side opposite to the tray mounting table of the tray component supply apparatus (i.e., on a back surface of the main body of the tray component supply apparatus), a second machine frame provided with a discharge section and a waiting section is provided to be movable in the vertical direction. The discharge section enables a tray which has become no longer necessary, to be discharged from a tray storage section as the tray stocker and to be placed on the discharge section, and the waiting section supplies a required tray to the tray storage section. In this way, a tray is replenished to the tray stocker or is discharged therefrom.

Patent Document 1 is Japanese unexamined, published patent application No. 8-37396 (pp. 2-3, FIG. 1).

In the aforementioned tray component supply apparatus, a problem arises in that the apparatus itself becomes enlarged in dimension because the second machine frame with the discharge section and the waiting section is provided beside the main body.

Accordingly, it is an object of the present invention to provide a tray component supply device which is compact.

DISCLOSURE OF THE INVENTION

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a main body side replenishment tray holding section provided at a part over or under the tray stocker of the apparatus main body for externally receiving and holding a replenishment tray which is a component supply tray loaded with components; and a tray stocker side replenishment tray holding section provided at an upper or lower part of the tray stocker for slidably holding the replenishment tray; and wherein the replenishment tray held by the main body side replenishment tray holding section is transferred to the tray stocker side replenishment tray holding section with the tray stocker side replenishment tray holding section positioned to a position close to the main body side replenishment tray holding section.

With this construction, since the main body side replenishment tray holding section for externally receiving and holding the replenishment tray is provided at the upper or lower part of the apparatus main body, and since the replenishment tray held by the main body side replenishment tray holding section is transferred to the tray stocker side replenishment tray holding section with the tray stocker side replenishment tray holding section positioned to a position close to the main body side replenishment tray holding section, it can be realized to provide the tray component supply apparatus which is made to be compact without enlarging the apparatus in the lateral direction.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a main body side replenishment tray holding section provided at a part over or under the tray stocker of the apparatus main body for externally receiving and holding a replenishment tray which is a component supply tray loaded with components; a tray stocker side replenishment tray holding section provided at an upper or lower part of the tray stocker for slidably holding the replenishment tray; and tray transfer means for transferring the replenishment tray held by the main body side replenishment tray holding section to the tray stocker side replenishment tray holding section with the tray stocker side replenishment tray holding section positioned to a position close to the main body side replenishment tray holding section.

With this construction, since the main body side replenishment tray holding section for externally receiving and holding the replenishment tray is provided at the upper or lower part of the apparatus main body, and since the tray transfer means transfers the replenishment tray held by the main body side replenishment tray holding section to the tray stocker side replenishment tray holding section with the tray stocker side replenishment tray holding section positioned to a position close to the main body side replenishment tray holding section, it can be realized to provide the tray component supply apparatus which is made to be compact without enlarging the apparatus in the lateral direction.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a main body side replenishment tray holding section provided at a part over the tray stocker of the apparatus main body for externally receiving and holding a replenishment tray which is a component supply tray loaded with components; and a tray stocker side replenishment tray holding section provided at an upper surface of a top plate of the tray stocker for slidably holding the replenishment tray; and tray transfer means for transferring the replenishment tray held by the main body side replenishment tray holding section to the tray stocker side replenishment tray holding section with the tray stocker side replenishment tray holding section positioned to a position close to the main body side replenishment tray holding section.

With this construction, since the main body side replenishment tray holding section for externally receiving and holding the replenishment tray is provided at the upper part of the apparatus main body, and since the tray transfer means transfers the replenishment tray held by the main body side replenishment tray holding section to the tray stocker side replenishment tray holding section with the tray stocker side replenishment tray holding section positioned to a position close to the main body side replenishment tray holding section, it can be realized to provide the tray component supply apparatus which is made to be compact without enlarging the apparatus in the lateral direction. Further, since the replenishment tray is replenished to the main body side replenishment tray holding section provided at the upper part of the apparatus main body, it becomes easier to work.

In the tray component supply apparatus according to the present invention, the main body side replenishment tray holding section comprises a frame member formed to be rectangular and first replenishment tray holding members which are protruded from a pair of facing side plates of the frame member to be movable inward in the horizontal direction for holding the replenishment tray. With this construction, the main body side replenishment tray holding section is able to hold the replenishment tray once in the frame member and to transfer the replenishment tray being held, easily upon request.

In the tray component supply apparatus according to the present invention, the frame member is provided at an upper part of the apparatus main body to be drawable in the horizontal direction so that the replenishment tray is replenished with the frame member drawn out. With this construction, since the main body side replenishment tray holding section is drawn out in the horizontal direction, has the replenishment tray placed inside thereof, and is returned into the apparatus main body, the replenishment tray can be replenished easily.

In the tray component supply apparatus according to the present invention, the frame member is bodily provided at an upper part of the apparatus main body, and a top plate of the apparatus main body is constructed to be opened and closed so that the replenishment tray is replenished with the top plate opened. With this construction, since the replenishment tray is stored inside with the top plate of the apparatus main body opened, the replenishment tray can be replenished easily.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises first replenishment tray holding members provided at a part over the tray stocker of the apparatus main body and movable between a holding position for externally receiving and holding a replenishment tray which is a component supply tray loaded with components and a holding release position for releasing the holding; first replenishment tray holding member moving means for moving the first replenishment tray holding members between the holding position and the holding release position; and second replenishment tray holding members provided at an upper surface of a top plate of the tray stocker for slidably holding the replenishment tray; wherein the first replenishment tray holding members and the second replenishment tray holding members are provided at respective positions not interfering with each other for making it possible to simultaneously hold the same replenishment tray.

With this construction, the replenishment tray received externally is held by the first replenishment tray holding members positioned at the holding position, the second replenishment tray holding members are positioned to become ready to simultaneously hold the same component supply tray together with the first replenishment tray holding members, and the first replenishment tray holding members positioned at the holding position are moved to the holding release position, so that the replenishment tray is transferred from the first replenishment tray holding members to the second replenishment tray holding members. Accordingly, the transfer of the replenishment tray from the first replenishment tray holding members to the second replenishment tray holding members can be done smoothly, so that it can be realized to suppress the vibration of the replenishment tray during the transfer motion.

In the tray component supply apparatus according to the present invention, the first replenishment tray holding members are protruded to be movable inward from a pair of facing side plates of a frame member which is provided at an upper part of the apparatus main body to be drawable horizontally, so that the replenishment tray can be mounted on the first replenishment tray holding members with the frame member drawn out. With this construction, it can be done easily to replenish the replenishment tray.

In the tray component supply apparatus according to the present invention, each of the second replenishment tray holding members includes plural members which are spaced on a straight line parallel to the direction in which the component supply tray is drawn out. With this construction, the replenishment tray held by the second replenishment tray holding members can be drawn out reliably without chatter.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a main body side replenishment tray holding section provided at a part under the tray stocker of the apparatus main body for externally receiving and holding a replenishment tray which is a component supply tray loaded with components; and a tray stocker side replenishment tray holding section provided at a lower part of the tray stocker for slidably holding the replenishment tray; and wherein the replenishment tray held by the main body side replenishment tray holding section is transferred to the tray stocker side replenishment tray holding section with the tray stocker side replenishment tray holding section positioned to a position close to the main body side replenishment tray holding section.

With this construction, since the replenishment tray can be replenished from the lower part of the apparatus main body, it can be realized to provide the tray component supply apparatus which is made to be compact without enlarging the apparatus in the lateral direction. Further, since in replenishing the replenishment tray to the apparatus main body which may be made to be tall, the replenishment tray is supplied to the main body side replenishment tray holding section provided at the lower part of the apparatus main body, the replenishment can be done with ease to work.

In the tray component supply apparatus according to the present invention, the tray stocker side replenishment tray holding section includes replenishment tray holding members movable between a holding position for slidably holding the replenishment tray and a holding release position for releasing the holding, and the tray component supply apparatus further comprises replenishment tray holding member moving means for moving the replenishment tray holding members between the holding position and the holding release position to move the replenishment tray held by the main body side replenishment tray holding section to the replenishment tray holding members. With this construction, it can be done reliably in a simplified construction to move the replenishment tray held by the main body side replenishment tray holding section to the replenishment tray holding members.

In the tray component supply apparatus according to the present invention, the main body side replenishment tray holding section is constituted to be drawable in the horizontal direction, so that the replenishment tray can be replenished with the main body side replenishment tray holding section drawn out. With this construction, since the main body side replenishment tray holding section is drawn out in the horizontal direction, has the replenishment tray placed inside thereof, and is returned into the apparatus main body, the replenishment tray can be replenished easily.

In the tray component supply apparatus according to the present invention, the replenishment tray held by the tray stocker side replenishment tray holding section is stored at a predetermined location in the tray stocker after drawn out once to the component delivery position. With this construction, since the component delivery position is utilized as a location for a temporary turnout, it can be realized without providing any additional turnout to store the replenishment tray held by the tray stocker side replenishment tray holding section, at a predetermined location in the tray stocker. Therefore, the apparatus can be made to be compact.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises an main body side empty tray holding section provided at a part under or over the tray stocker of the apparatus main body and being capable of holding an empty tray which is a component supply tray emptied of components and of discharging the empty tray out; and an tray stocker side empty tray holding section provided at a lower or upper part of the tray stocker for slidably holding the empty tray; and wherein the empty tray held by the tray stocker side empty tray holding section is transferred to the main body side empty tray holding section with the tray stocker side empty tray holding section positioned to a position close to the main body side empty tray holding section.

With this construction, since the main body side empty tray holding section capable of holding the empty tray and of discharging the empty tray out is provided at the lower or upper part of the apparatus main body, and since the empty tray held by the tray stocker side empty tray holding section is transferred to the main body side empty tray holding section, it can be realized to provide the tray component supply apparatus which is made to be compact without enlarging the apparatus in the lateral direction.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a tray discharge section provided at a part under or over the tray stocker of the apparatus main body for holding an empty tray which is a component supply tray emptied of components and for discharging the empty tray out; empty tray holding members provided on a lower surface of a bottom plate or an upper surface of a top plate of the tray stocker and movable between a holding position for slidably holding the empty tray and a holding release position for releasing the holding; and empty tray holding member moving means for moving the empty tray holding members between the holding position and the holding release position to move the empty tray supported by the empty tray holding members to the tray discharge section.

With this construction, since the tray discharge section for holding the empty tray and for discharging the empty tray out is provided at the lower part or the upper part of the apparatus main body, and since the empty tray holding member moving means transfers the empty tray held by the empty tray holding members to the tray discharge section, it can be realized to provide the tray component supply apparatus which is made to be compact without enlarging the apparatus in the lateral direction.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a tray discharge section provided at a part under the tray stocker of the apparatus main body for holding an empty tray which is a component supply tray emptied of components and for discharging the empty tray out; empty tray holding members provided on a lower surface of a bottom plate of the tray stocker and movable between a holding position for slidably holding the empty tray and a holding release position for releasing the holding; and empty tray holding member moving means for moving the empty tray holding members between the holding position and the holding release position to move the empty tray supported by the empty tray holding members to the tray discharge section.

With this construction, since the tray discharge section for holding the empty tray and for discharging the empty tray out is provided at the lower part of the apparatus main body, and since the empty tray holding member moving means moves the empty tray held by the empty tray holding members to the tray discharge section, it can be realized to provide the tray component supply apparatus which is made to be compact without enlarging the apparatus in the lateral direction. Further, since the empty tray held by the empty tray holding members is transferred to the tray discharge section by falling down, the apparatus can be simplified in construction.

In the tray component supply apparatus according to the present invention, the empty tray holding member moving means is provided beside the tray discharge section and moves the empty tray holding members to the holding release position after the tray stocker is moved down to make the empty tray holding members come close to the tray discharge section. With this construction, when the empty tray holding members holding the empty tray come close to the tray discharge section, the empty tray being held is transferred to the tray discharge section automatically and reliably.

In the tray component supply apparatus according to the present invention, engaging portions of the empty tray holding members and engaging portions of the empty tray holding member moving means are engageable and disengageable only in the vertical direction. With this construction, only when the engaging portions of the both members are brought into engagement by the downward movement of the tray stocker, the empty tray holding members are moved to the holding release position to release the holding of the empty tray, whereas in other cases, the empty tray holding members remain to hold the empty tray. Accordingly, it can be realized in a simplified construction to make engagement of the empty tray holding members with the empty tray holding member moving means.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein the apparatus further comprises a tray stocker side empty tray holding section provided at an upper part of the tray stocker for slidably holding an empty tray; empty tray holding members provided at a part over the tray stocker of the apparatus main body and movable between a holding position for holding the empty tray which is a component supply tray emptied of components and a holding release position for releasing the holding; and empty tray holding member moving means for moving the empty tray holding members between the holding position and the holding release position to move the empty tray held by the tray stocker side empty tray holding section to the empty tray holding members.

With this construction, since the main body side empty tray holding section capable of holding the empty tray and capable of discharging the same out is provided at the upper part of the apparatus main body, and since the empty tray holding member moving means can transfer the empty tray held by the empty tray holding members to the main body side empty tray holding section to discharge the empty tray from the upper part of the apparatus main body, it can be realized to provide the tray component supply apparatus which is made to be compact without enlarging the apparatus in the lateral direction.

In the tray component supply apparatus according to the present invention, the empty tray holding member moving means is provided at an upper part of the tray stocker, and the empty tray holding member moving means moves the empty tray holding members to the holding release position when the tray stocker is moved upward to make the tray stocker side empty tray holding section come close to the empty tray holding members and moves the empty tray holding members to the holding position after the empty tray is moved to a transfer position. With this construction, when the tray stocker side empty tray holding section holding the empty tray comes close to the empty tray holding members, the empty tray being held can be transferred to the empty tray holding members automatically and reliably.

In the tray component supply apparatus according to the present invention, a top plate of the apparatus main body is constructed to be opened and closed, so that the empty tray held by the empty tray holding members is taken out with the top plate opened. With this construction, since the empty tray is taken out with the top plate of the apparatus main body opened, the empty tray can be taken out easily.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein a main body side replenishment tray holding section for externally receiving and holding a replenishment tray which is a component supply tray loaded with components is provided at the uppermost end position on a moving locus of the tray stocker, while a tray discharge section for holding an empty tray which is a component supply tray emptied of components and for discharging the empty tray out is provided at the lowermost end position of the moving locus; and wherein the tray stocker is provided at its upper end part with a tray stocker side replenishment tray holding section for receiving and holding the replenishment tray transferred from the main body side replenishment tray holding section and at its lower end part with empty tray holding members for holding the empty tray to be discharged to the tray discharge section.

With this construction, in the state that the replenishment tray has been replenished at the main body side replenishment tray holding section, the tray stocker easily transfers the replenishment tray held by the main body side replenishment tray holding section, to the tray stocker side replenishment tray holding section when reaching the uppermost end portion and easily transfers the empty tray held by the empty tray holding members provided on the lower surface of the tray stocker, to the tray discharge section. Therefore, it can be realized to provide the tray component supply apparatus which is made to be compact without enlarging the apparatus in the lateral direction.

The present invention resides in a tray component supply apparatus which comprises a tray stocker provided inside an apparatus main body to be movable in a vertical direction for storing plural component supply trays arranged in the vertical direction; a tray stocker drive device for moving the tray stocker in the vertical direction to position the tray stocker to a predetermined position; and a tray drawing mechanism for drawing a component supply tray stored in the tray stocker to a component delivery position; wherein a main body side replenishment tray holding section for externally receiving and holding a replenishment tray which is a component supply tray loaded with components is provided at the lowermost end position on a moving locus of the tray stocker, while an main body side empty tray holding section capable of holding an empty tray which is a component supply tray emptied of components and of discharging the empty tray out is provided at the uppermost end position of the moving locus; and wherein the tray stocker is provided at its lower end part with a tray stocker side replenishment tray holding section for receiving and holding the replenishment tray transferred from the main body side replenishment tray holding section and at its upper end part with empty tray holding members for holding the empty tray to be moved to the main body side empty tray holding section.

With this construction, in the state that the replenishment tray has been replenished at the main body side replenishment tray holding section, the tray stocker easily transfers the replenishment tray held by the main body side replenishment tray holding section provided at the lower end part of the tray stocker, to the tray stocker side replenishment tray holding section when reaching the lowermost end portion and easily transfers the empty tray held by the empty tray holding members provided at the upper end part of the tray stocker, to the main body side empty tray holding section when reaching the uppermost end position. Accordingly, it can be realized to provide the tray component supply apparatus which is made to be compact without enlarging the apparatus in the lateral direction.

PREFERRED EMBODIMENTS TO PRACTICE THE INVENTION

1) First Embodiment

Figure 1:
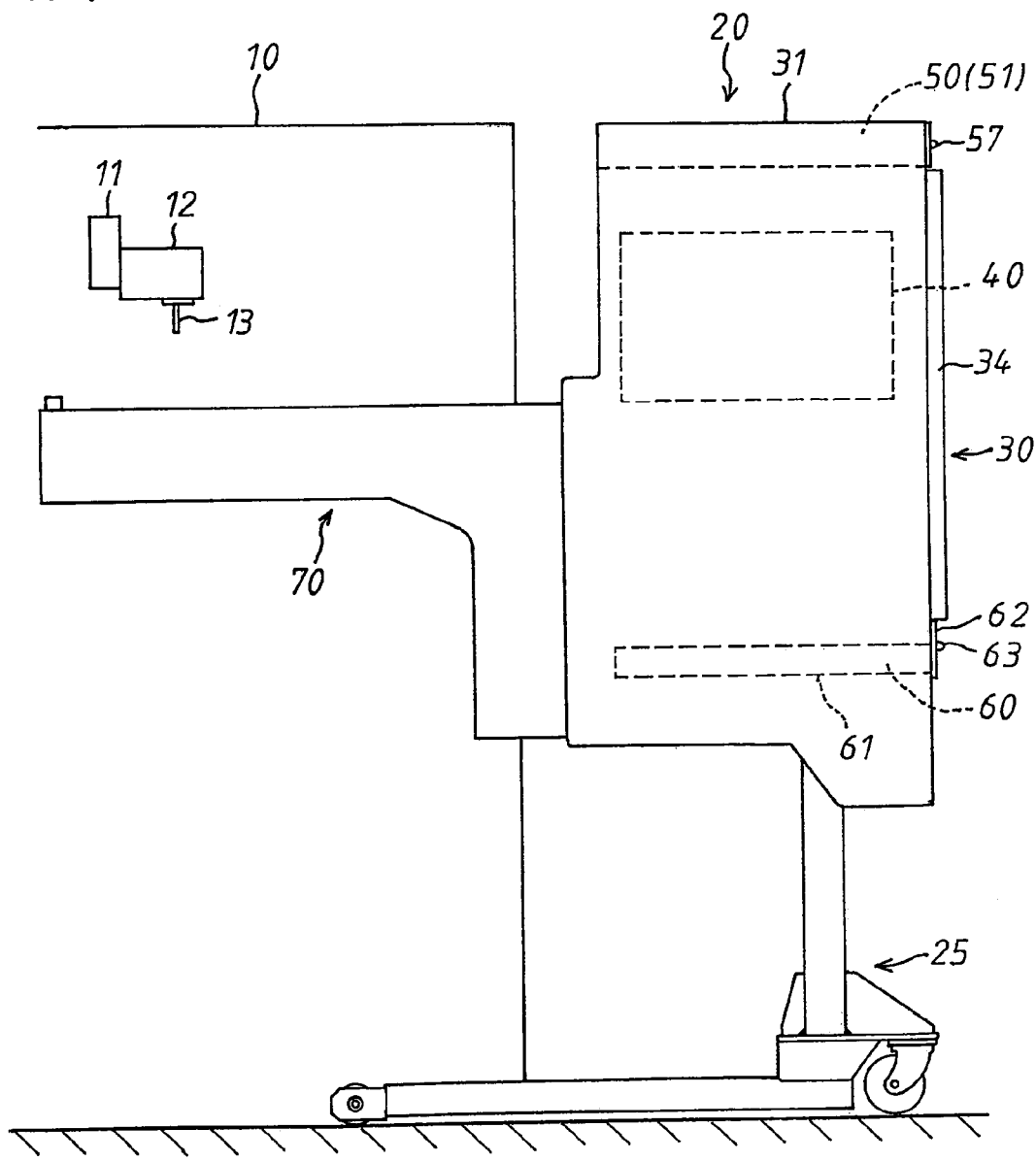
FIG. 1 is a side elevational view of a tray component supply apparatus in a first embodiment according to the present invention.

Hereafter, a tray component supply apparatus in a first embodiment according to the present invention will be described with reference to the drawings. FIG. 1 is a left side elevational view of a tray component supply apparatus placed beside an electronic component mounting apparatus. The electronic component mounting apparatus 10 is provided with a board transfer device (not shown) which is provided on a base for performing the loading/unloading and the positioning support of boards, a movable head 11 which is carried to be movable relative to the base in two directions including an X-direction and a Y-direction, and a component mounting device 12 having a suction nozzle 13 which is attached to the movable head 11 for attracting and picking up components supplied by the tray component supply apparatus 20 to mount the components on boards positioned and supported on the board transfer device.

The tray component supply apparatus 20 is for storing a plurality of component supply trays T, which are formed to be a rectangular tray shape for storing plural kinds of components on a kind-by-kind basis, and for supplying the electronic component mounting apparatus 10 with a component supply tray T storing desired components upon request by moving the component supply tray T to a component pickup area for the electronic component mounting apparatus 10. As shown in FIG. 1, the tray component supply apparatus 20 is composed of a main body as an apparatus main body placed beside the electronic component mounting apparatus 10 with its front facing with the electronic component mounting apparatus 10, a tray stocker 40 housed inside the main body 30 to be slidable in the vertical direction, a main body side replenishment tray holding section 50 provided at a part over the tray stocker 40 of the main body 30 for externally receiving and holding a replenishment tray T, a tray discharge section 60 as a main body side empty tray holding section provided under the tray stocker 40 for holding an empty tray Ta and for discharging the empty tray Ta out, a tray mounting table 70 protruding from the front of the main body 30 in the horizontal direction for mounting a component supply tray T on an upper surface thereof, and a caster section 25 provided at the lower port of the main body 30 for movably supporting the tray component supply apparatus 20.

Figure 2:
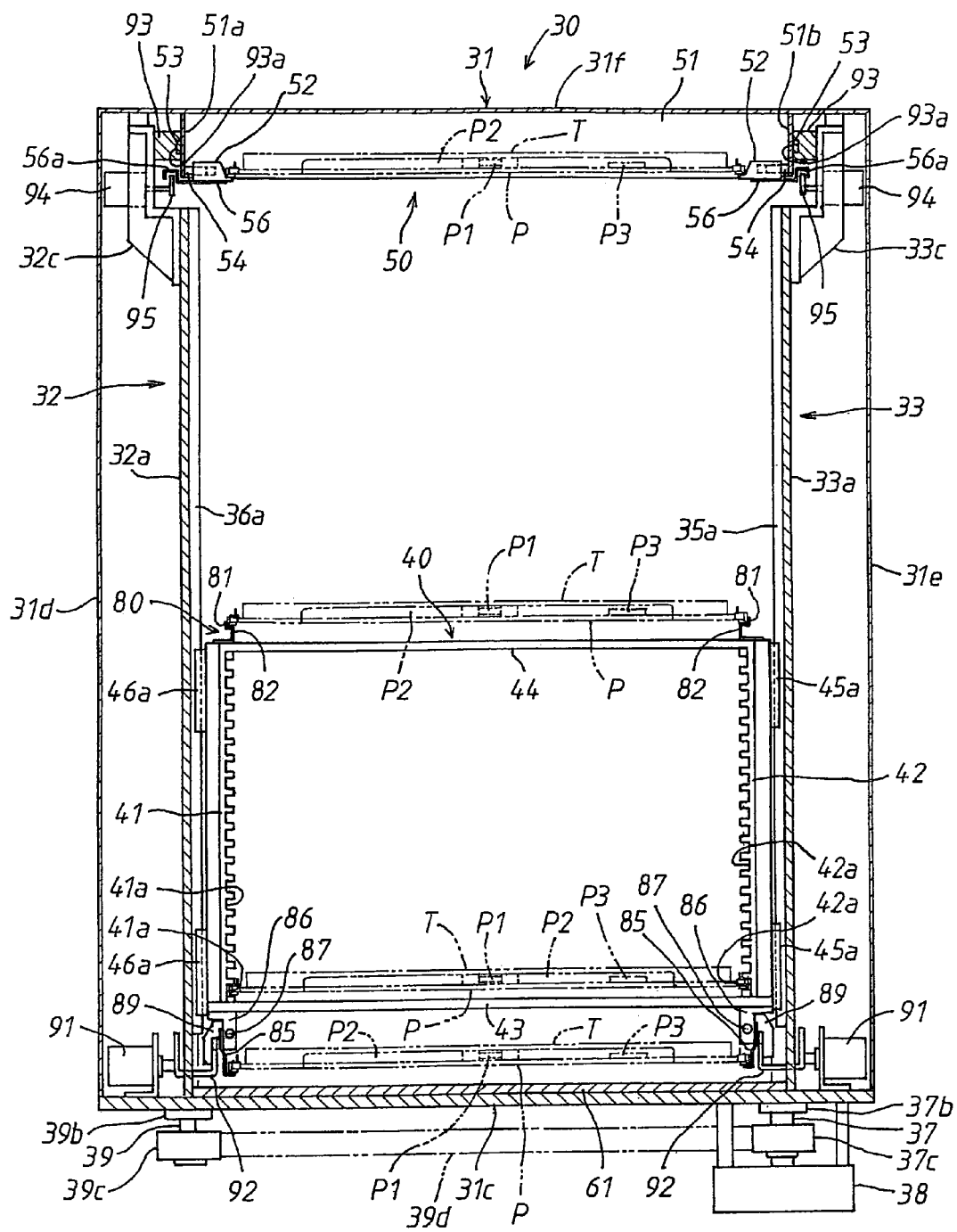
FIG. 2 is a front view showing the interior structure of a main body shown in FIG. 1.
Figure 3:
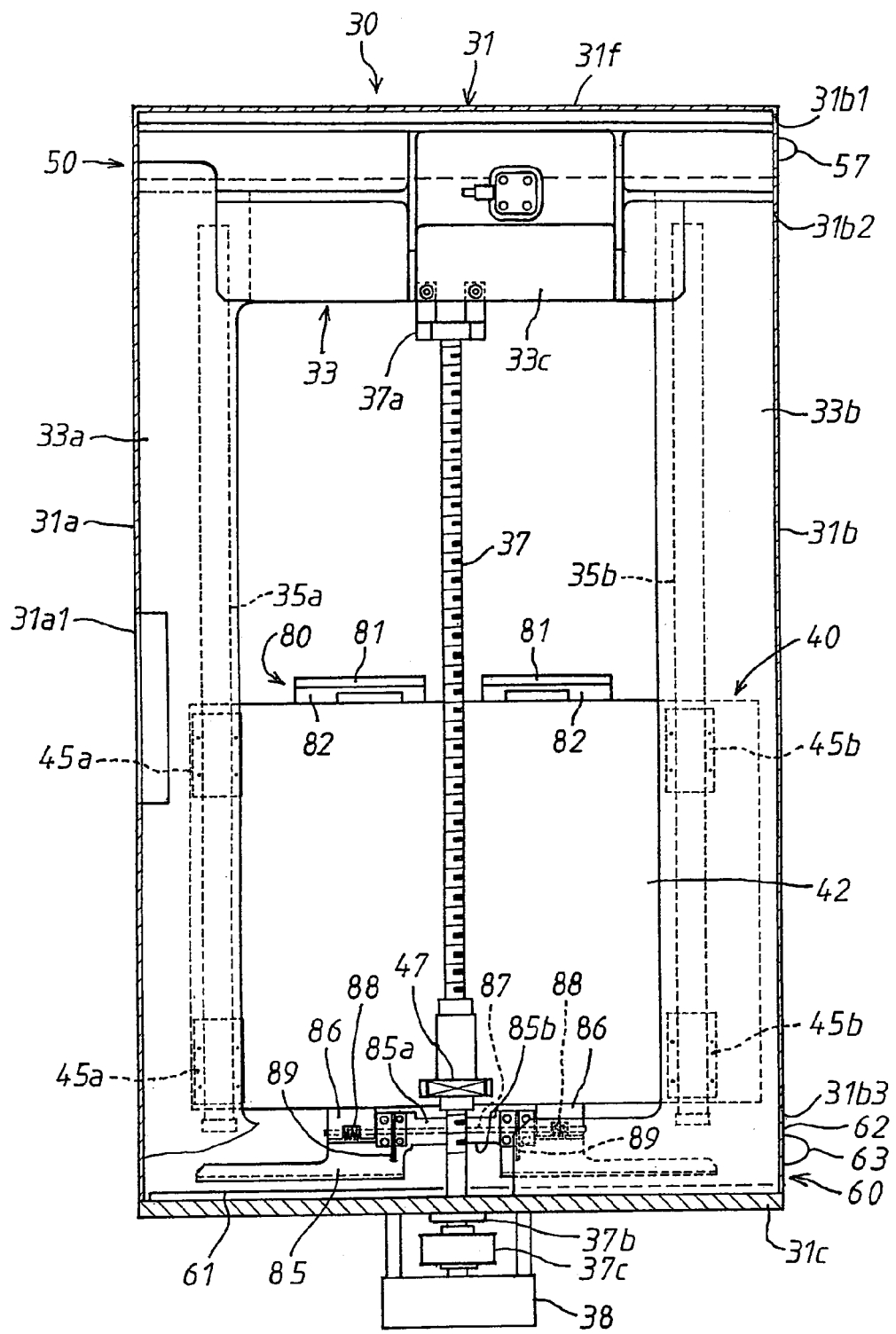
FIG. 3 is a side elevational view showing the interior structure of the main body shown in FIG. 1.

The main body 30 is provided with a box-like housing 31, as shown in FIGS. 2 and 3. A hatch 31a1 through which the component supply tray T is moved toward and away from the tray mounting table 70 is formed to elongate in the horizontal direction at an approximately center in the vertical direction of a front plate 31a of the housing 31. A first opening 31b1 for inserting the main body side replenishment tray holding section 50, a second opening 31b2 for moving the component supply tray T toward and away from the tray stocker 40, and a third opening 31b3 for inserting the tray discharge section 60 are formed on a back plate 31b of the housing 31 in order from top toward bottom. A rear door 34 is attached at the back surface of the housing 31 for opening and closing the second opening 31b2 (refer to FIG. 1).

As shown in FIG. 2, left and right frame sections 32, 33 each taking a U-letter shape opening downward and bodily formed are provided to be upright respectively at left and right end parts on the upper surface of a bottom plate 31c of the housing 31. As shown in FIG. 3, the right frame section 33 is composed of a front right frame 33a secured to the bottom plate 31c at its lower end, a rear right frame 33b secured to the bottom plate 31c at its lower end, and an upper right frame 33c secured at its opposite ends to the upper parts of the front right and rear right frames 33a, 33b. Like the right frame 33, the left frame section 32 is composed of a front left frame 32a, a rear left frame (not shown) and an upper left frame 32c.

Front right and rear right rails 35a, 35b extending in the vertical direction are secured to respective inner wall surfaces of the front right and rear right frames 33a, 33b. Two front side sliders 45a, 45a and two rear side sliders 45b, 45b which are secured in vertical juxtaposition respectively to a front part and a rear part on an outer wall surface of a right side plate 42 of the tray stocker 40 are engaged with the front right and rear right rails 35a, 35b to be slidable thereon. A front left rail 36a and a rear left rail (not shown) extending in the vertical direction are also secured to respective inner wall surfaces of the front left and rear left frames 32a. Two front side sliders 46a, 46a and two rear side sliders (not shown) which are secured in vertical juxtaposition respectively to a front part and a rear part on an outer wall surface of a left side plate 41 of the tray stocker 40 are engaged with these front left and rear left rails 36a to be slidable thereon. Thus, the tray stocker 40 is housed to be movable in the vertical direction inside the main body 30.

Further, as shown in FIG. 3, a ball screw 37 is provided to extend in the vertical direction between the front right rail 35a and the rear right rail 35b, and the ball screw 37 is supported at its upper end by a support member 37a secured to the upper right frame 33c and at its lower portion by a support member 37b secured to the bottom plate 31c. The lower end of the ball screw 37 passes through the bottom plate 31c and is connected to an output shaft of a motor 38. A pulley 37c is secured on the ball screw 37 between the motor 38 and the support member 37b. Further, a ball screw 39 similar to the ball screw 37 is provided also between the front left rail 36a and the rear left rail. However, any motor is not directly coupled to the ball screw 39, and the ball screw 39 together with the ball screw 37 is simultaneously rotated by means of a belt 39d wound between both of pulleys 37c and 39c.

These ball screws 37 and 39 are rotatably screw-engaged with nuts 47 which are secured to the right side plate 42 and the left side plate 41 of the tray stocker 40. Upon rotation of the motor 38, the ball screw 37 is rotated about the motor axis, and the ball screw 39 is rotated by being driven through the belt 39d. Thus, tray stocker 40 is moved up and down along the rails 35a, 35b, 36a.

As shown in FIG. 2, plural guide slots 41a and 42a horizontally extending over the entire width of the tray stocker 40 are formed on inner wall surfaces of the left and right side plates 41, 42 of the tray stocker 40 in face to face relation. Pallets P each mounting the component supply tray T on the upper surface thereof are slidably engageable with these guide slots 41a, 42a at their left and right ends. Therefore, inside the tray stocker 40, it is possible to store plural pallets P and hence, the component supply trays T in such a manner that they are juxtaposed vertically and slidable horizontally. It is to be noted that the component supply trays T are for storing plural components on the upper surfaces thereof and that of the component supply trays T, those loaded with components will be referred to as replenishment trays Th, whereas those emptied of components will be referred to as empty trays Ta.

Figure 4:
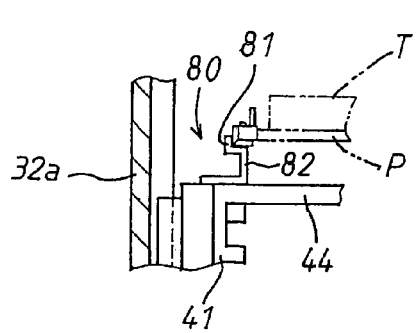
FIG. 4 is an enlarged fragmentary view showing the neighborhood of a tray stocker side replenishment tray holding section shown in FIG. 2.

As shown in FIGS. 2 to 4, a tray stocker side replenishment tray holding section 80 is provided on the upper surface of a top plate 44 of the tray stocker 40. The tray stocker side replenishment tray holding section 80 is provided with plural (four in this embodiment) second replenishment tray holding members 81 each being slender with a hook-like cross-section. These second replenishment tray holding members 81 are attached to left and right end parts of the top plate 44 of the tray stocker 40 through support members 82 in such a way that plural (two) members 81 are in alignment on a straight line parallel to the drawing direction (i.e., on a straight line extending in the front-rear direction (the left-right direction in FIG. 3)) at either end part with a predetermined distance therebetween. The respective second replenishment tray holding members 81 provided at the left and right end parts of the top plate 44 are placed to face with each other, so that they are able to position the pallet P in the left-right direction (the left-right direction in FIG. 2) as well as to hold the pallet P to be slidable in the front-rear direction. With this arrangement, it is possible to draw the replenishment tray Th held by the second replenishment tray holding members 81 reliably without chatter.

Figure 5:
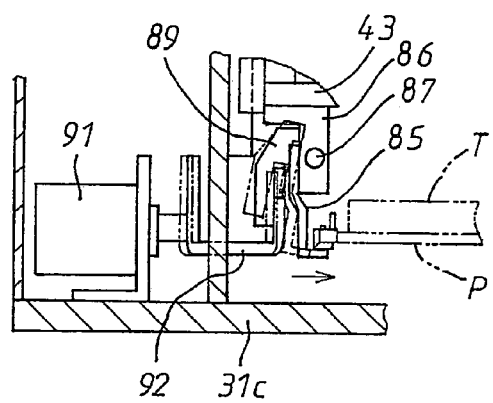
FIG. 5 is an enlarged fragmentary view showing the neighborhood of an empty tray holding section shown in FIG. 2.

As shown in FIGS. 2, 3 and 5, empty tray holding members 85 constituting a tray stocker side empty tray holding section are provided on the lower surface of the bottom plate 43 of the tray stocker 40. The empty tray holding members 85 are slender with a hook-like cross-section and are swingably attached to the left and right end parts of the bottom plate 43 of the tray stocker 40 respectively through support members 86 secured to the bottom plate 43 in such a way that they are arranged in parallel to each other along a straight line extending in the front-rear direction (the left-right direction in FIG. 3). Over a center portion in the front-rear direction of each empty tray holding member 85, there is provided a shaft-supported portion 85a, which is supported on a support shaft 87 whose opposite ends are rotatably carried by the support members 86.

Torsion coil springs 88 fitted around the support shafts 87 are interposed between the empty tray holding members 85 and the support members 86, and the empty tray holding members 85 are urged by the springs 88 toward inside (in the direction indicated by the arrow in FIG. 5). The empty tray holding members 85 being urged are restricted from further rotations upon engagement with stops (not shown) thereby to be held in the holding state (shown by the solid line in FIG. 5). The both empty tray holding members 85 provided at the left and right end parts on the bottom plate 43 of the tray stocker 40 are arranged to face with each other in the aforementioned holding state, so that they position the pallet P in the left-right direction (the left-right direction in FIG. 2) and hold the pallet P to be slidable in the front-rear direction (the left-right direction in FIG. 3).

As shown typically in FIG. 5, a pair of engaging portions 89 are secured to the outside wall surfaces of the empty tray holding members 85. When the tray stocker 40 is moved down to be positioned at the lowermost end, the engaging portions 89 are brought into engagement with engaging portions 92 connected to actuators 91. That is, the both engaging portions 89 and 92 are engageable and disengageable only in the vertical direction. With this construction, only when the tray stocker 40 is moved down to bring about engagement between the engaging portions 89, 92 of the both members, the empty tray holding members 85 are moved to their holding release positions to release the holding of the empty tray Ta, whereas in other cases, the empty tray holding members 85 remain to hold the empty tray Ta. Accordingly, it can be realized in a simplified construction to engage the empty tray holding members 85 with the empty tray holding member moving means, that is, with the actuators 91. The actuators 91 are secured to the bottom plates 31c of the housing 31.

When the actuators 91 are driven to slide the engaging portions 92 outside with the both engaging portions 89, 92 being held engaged, the empty tray holding members 85 are pivoted outward (in the direction opposite to the arrow in FIG. 5) against the urging forces and are brought into the holding release state (shown by the two-dot-dash line in FIG. 5) to be held in that state. Thus, the pallet P is released from being held and falls down into the tray discharge section 60. When the actuators 91 are driven to slide the engaging portions 92 inward, the empty tray holding members 85 are pivoted inward (in the direction indicated by the arrow in FIG. 5) by the urging forces to be restored to the holding state. Cutouts 85b are formed at the center portions in the front-rear direction of the empty tray holding members 85, and thus, when brought into the holding release state, the empty holding members 85 do not come into contact with the ball screws 37, 39.

Figure 6:
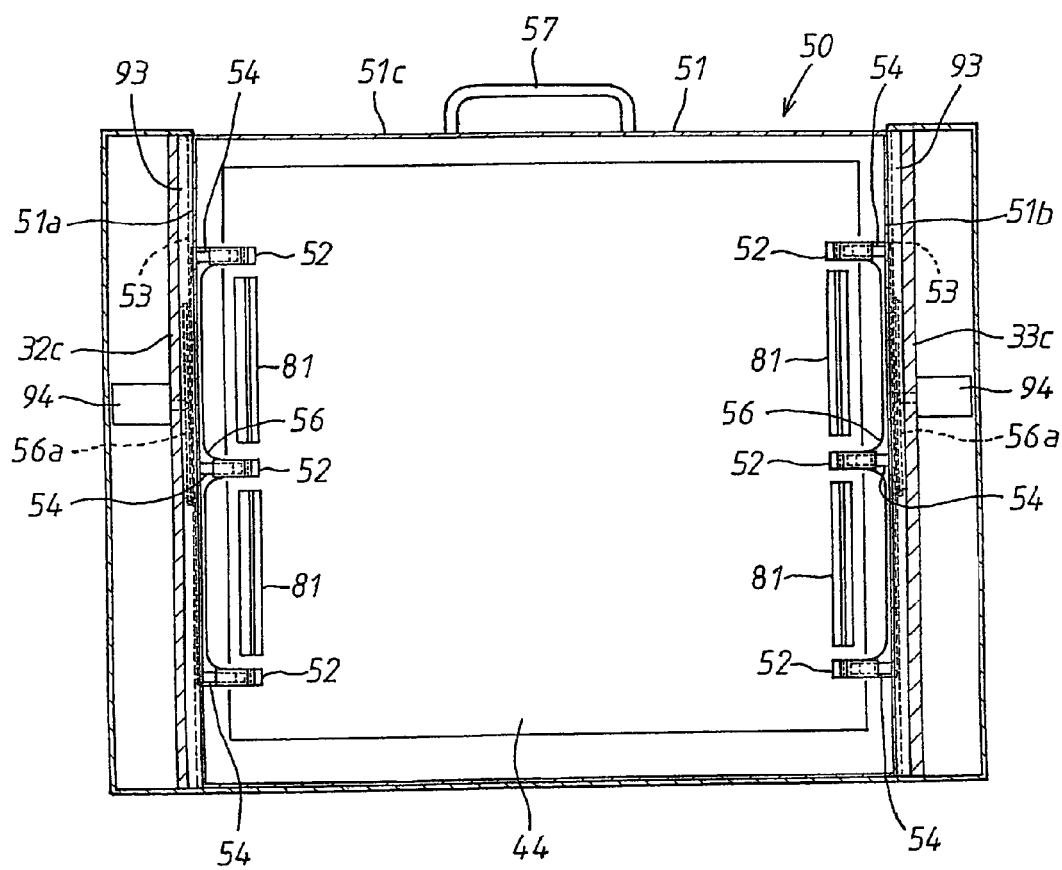
FIG. 6 is a plan view showing the interior structure of the main body shown in FIG. 1.

As shown in FIGS. 2 and 3, at a part over the tray stocker 40 of the main body 30, a main body side replenishment tray holding section 50 for externally receiving and holding the replenishment tray Th is provided to be drawable in the horizontal direction (in the front-rear direction). The main body side replenishment tray holding section 50 is provided with a frame member 51, which is formed to be rectangular and is opened at upper and lower sides, as shown in FIG. 6. Rails 53 extending in the front-rear direction (the vertical direction in FIGS. 6 and 7) are respectively secured to outer wall surfaces of left and right side plates 51a, 51b which constitute a pair of facing side plates of the frame member 51. These rails 53, 53 are slidably engaged respectively with engaging slots 93a, 93a of rails 93, 93 which are secured respectively to inner wall surfaces of the upper left and right frames 32c, 33c.

Figure 8:
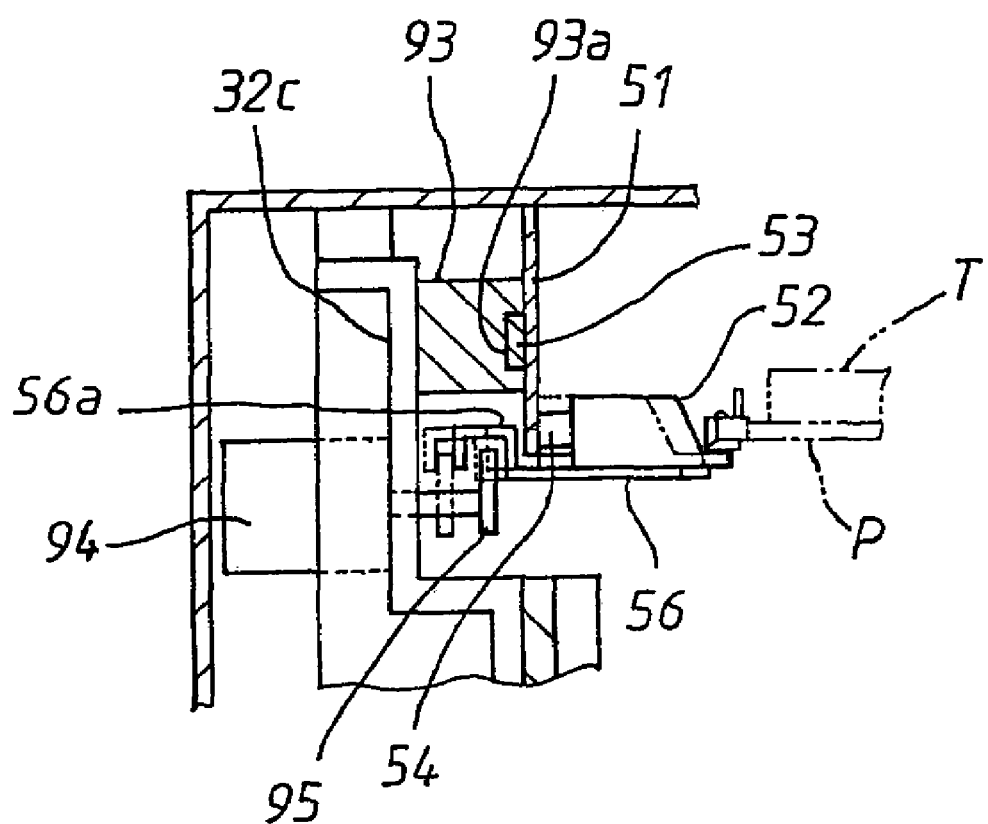
FIG. 8 is an enlarged fragmentary view showing the neighborhood of a main body side replenishment tray holding section shown in FIG. 2.

From the left and right side plates 51a, 51b of the frame member 51, plural first replenishment tray holding members 52 for holding the replenishment tray Th are protruded to be movable toward and way from the center of the frame member 51 in the horizontal direction. The first replenishment tray holding members 52 are movably fitted on support members 54 which protrude from the inner wall surfaces of the left and right side plates 51a, 51b, respectively. The first replenishment tray holding members 52 contain coil springs 55 therein, by which the first replenishment tray holding members 52 are urged toward the inside of the frame member 51. The first replenishment tray holding members 52 being urged are restricted from sliding by being engaged at engaging hollow portions 56a of connection members 56 referred to later respectively with the left and right side plates 51a, 51b of the frame member and thus, are held in the holding state (indicated by the solid line in FIG. 8). The both of the first replenishment tray holding members 52 provided on the left and right side plates 51a, 51b of the frame member 51 are arranged to face with each other in the foregoing holding state, so that they are able to position the pallet P in the left-right direction (the left-right direction in FIG. 2) and to hold the pallet P to be slidable in the front-rear direction (the vertical direction in FIG. 6).

Figure 7:
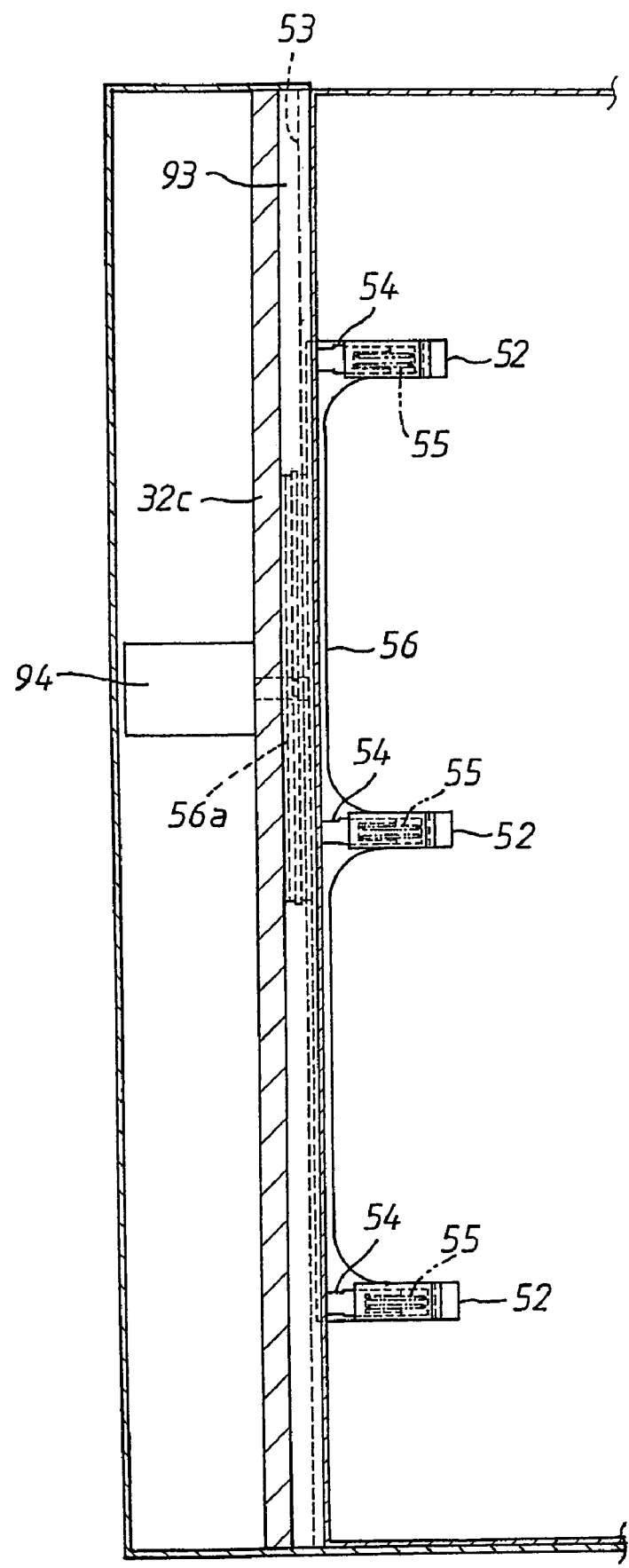
FIG. 7 is an enlarged fragmentary view showing the neighborhood of a main body side replenishment tray holding section shown in FIG. 6.

The plural first replenishment tray holding members 52 provided on the left side plate 51a are secured to respective inside ends of a connection member 56 formed to take an E-letter shape and are bodily slidable by the connection member 56 in the left-right direction as shown in FIG. 6. Similarly, the plural first replenishment tray holding members 52 provided on the right side plate 51b are bodily slidable by another connection member 56. An engaging hollow portion 56a (shown in FIGS. 2 and 8) opening downward are bodily formed at an outside end of each connection member 56, as shown in FIGS. 6 and 7. It is to be noted that the length of the engaging hollow portions 56a is set to be shorter than the length of the connection members 56 (e.g., the half length of the connection members 56). With the frame member 51 being received completely within the housing 31 as shown in FIG. 6, the engaging hollow portions 56a are respectively brought into engagement with engaging plates 95 coupled to the actuators 94. That is, the engaging hollow portions 56a are slidden to be engageable with, and disengageable from, the engaging plates 95, respectively. It is to be noted that the actuators 94 are secured respectively to the upper left and right frames 32c, 33c. With this construction, the main body side replenishment tray holding section 50 is able to hold a replenishment tray Th once within the frame member 51 and to easily transfer the supplied tray Th being held upon request.

When the actuators 94 are driven to slide the engaging plates 95 outwards with the engaging hollow portions 56a being engaged respectively with the engaging plates 95, the first replenishment tray holding members 52 are slidden outward against the urging forces of the coil springs 55 and are brought into a holding release state (indicated by the two-dot-chain line in FIG. 8) to be held in the state. Thus, the pallet P is released from being held by the first replenishment tray holding members 52 and is placed onto the second replenishment tray holding members 81 to be held thereby. When the actuators 94 are driven to slide the engaging plates 95 inward, the first replenishment tray holding members 52 are slidden inward by the urging forces to be restored to the holding state.

It is to be noted that the first and second tray holding members 52 and 81 are arranged at respective positions which do not interfere with each other, as shown in FIG. 6, and are able to hold the same replenishment tray Th simultaneously when the replenishment tray Th held on the first replenishment tray holding members 52 is transferred onto the second replenishment tray holding members 81. A grip 57 is provided on a rear plate 51c of the frame member 51.

As shown in FIGS. 2 and 3, the tray discharge section 60 for holding an empty tray Ta and for discharging the empty tray Ta out is provided at the lower part under the tray stocker 40 of the main body 30 to be drawable in the horizontal direction (in the front-rear direction). The tray discharge section 60 is provided with a tray-like receiving plate 61 which is formed to be rectangular for holding an empty tray Ta, and a rear plate 62 upstanding from the rear end of the receiving plate 61. The rear plate 62 is provided with a grip 63.

Figure 9:
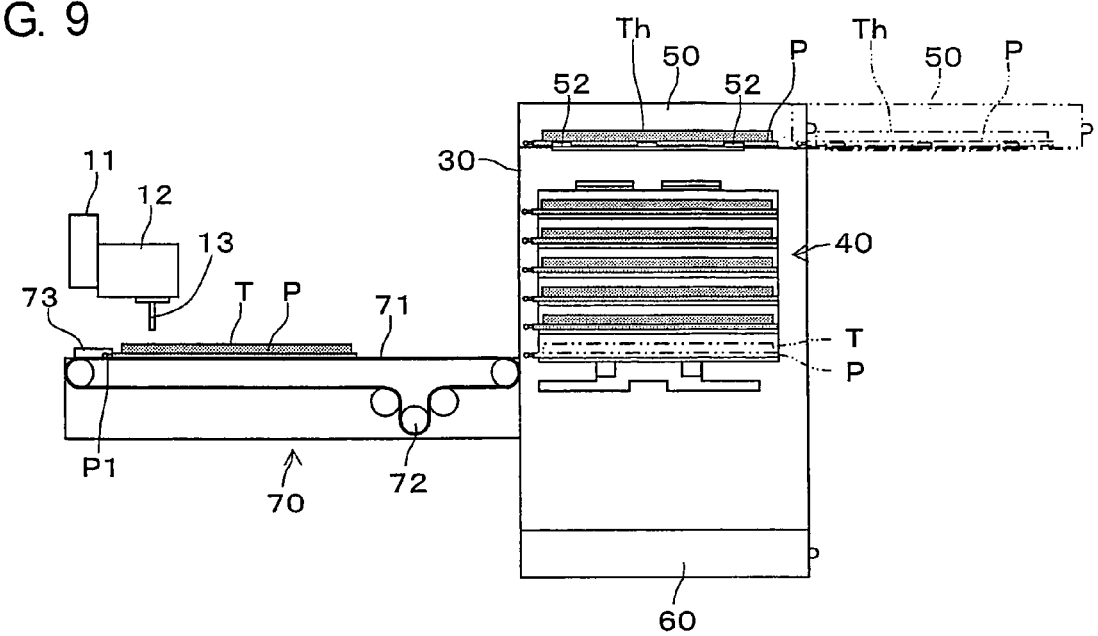
FIG. 9 is an explanatory view for explaining the operation of the tray component supply apparatus according to the present invention.

The tray mounting table 70 for mounting the component supply tray T at the upper surface thereof is attached to the front plate 31e of the main body 30. As shown in FIG. 9, a pair of belt conveyers 71, 71 are provided respectively at the left and right sides of the tray mounting table 70. The belt conveyers 71, 71 are arranged to support the left and right end parts of the pallet P. These belt conveyers 71, 71 are synchronously driven by a motor 72. Further, these belt conveyers 71, 71 have attached thereto a pallet coupling portion 73 movable synchronously with the belt conveyers 71, 71. The pallet coupling portion 73 is for grasping a grip portion P1 of the pallet P which is formed to be a T-letter shape (as overlooked). With this construction, when the motor 72 is driven, the pallet coupling portion 73 draws the pallet P to move the same carried on the belt conveyers 71, 71 to a component delivery position. This component delivery position means an area on the tray mounting table 70 in which the electronic component mounting apparatus 10 picks up the components. A rear end of the pallet P has an upright portion P2 extending upward as shown in FIG. 2, and a back surface of the upright portion P2 has affixed thereto a barcode seal P3 which is readable by a barcode reader 65 referred to later. The upright portion P2 also functions as a grip for use in drawing the pallet P out of the tray stocker 40.

Next, the operation of the tray component supply apparatus 20 as constructed above will be described with reference to FIG. 9 through FIG. 16. Upon receiving information on components to be mounted from the electronic component mounting apparatus 10, the tray component supply apparatus 20 moves the pallet coupling portion 73 on the tray mounting table 70 to a predetermined position in the main body 30 of the tray component supply apparatus 20 and moves the tray stocker 40 up and down, so that a pallet P mounting thereon a component supply tray T which is loaded with components to be mounted is positioned and secured at the same height as the tray mounting table 70. At this time, the T-letter shape grip portion P1 of the pallet P is inserted to be gripped into the T-letter shape cutout of the pallet coupling portion 73. During the up and down movements, the T-letter shape grip portion P1 of the pallet P is in the grip release state and passes through the cutout. Then, the pallet coupling portion 73 is moved to move the pallet P (shown by the two-dot-chain line in FIG. 9) within the tray stocker 40 to the component delivery position on the tray mounting table 70 (refer to FIG. 9). The component delivery position is within the moving area for the suction nozzle 13 of the electronic component mounting apparatus 10. Then, the suction nozzle 13 picks up components thereto and mounts the same on a board.

On the other hand, the electronic component mounting apparatus 10 knows the number of the components used and the number of components remaining with respect to each of the component supply trays T, and when the number of the components remaining has become few in number, issues an alert for replenishing the components which have become few in number. In response to this alert, a worker stores a pallet P which mounts thereon a replenishment tray Th storing the components, in the main body side replenishment tray holding section 50. That is, the worker draws the main body side replenishment tray holding section 50, places the replenishment tray Th on the first replenishment tray holding members 52 held in the holding state, and returns the main body side replenishment tray holding section 50 into the main body 30 (refer to FIG. 9). Then, the worker pushes a switch (not shown) to inform the tray component supply apparatus 20 and hence, the electronic component mounting apparatus 10 as to the completion of the storage. Since the foregoing replenishment of the component supply tray T is such that the main body side replenishment tray holding section 50 is drawn horizontally and is returned into the main body 30 after a replenishment tray Th is stored therein, one can easily restock the replenishment tray Th. Further, the foregoing replenishment of the component supply tray T can be done without moving the tray stocker 40 up and down and without moving the component supply tray T on the tray mounting table 70 to and from the tray stocker 40.

Figure 10:
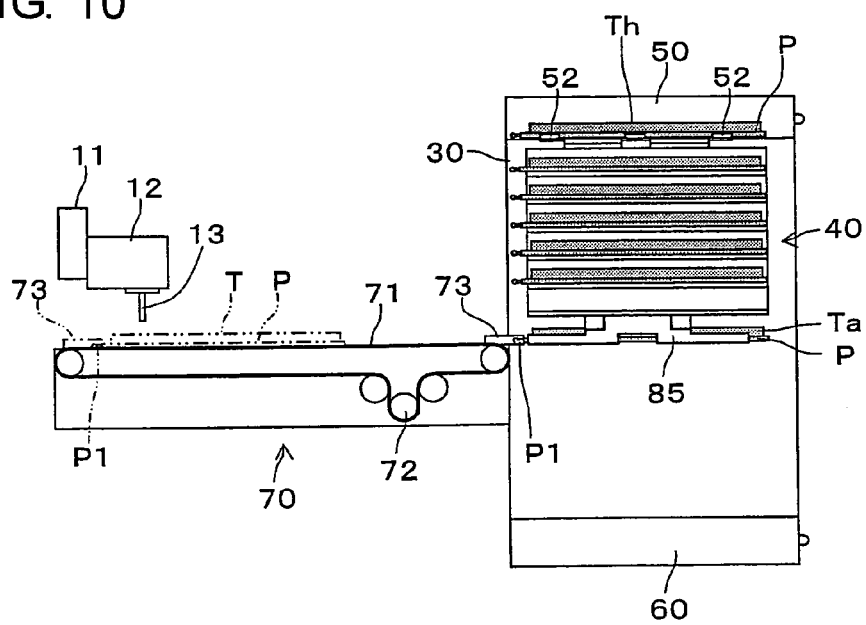
FIG. 10 is an explanatory view for explaining the operation of the tray component supply apparatus according to the present invention.
Figure 11:
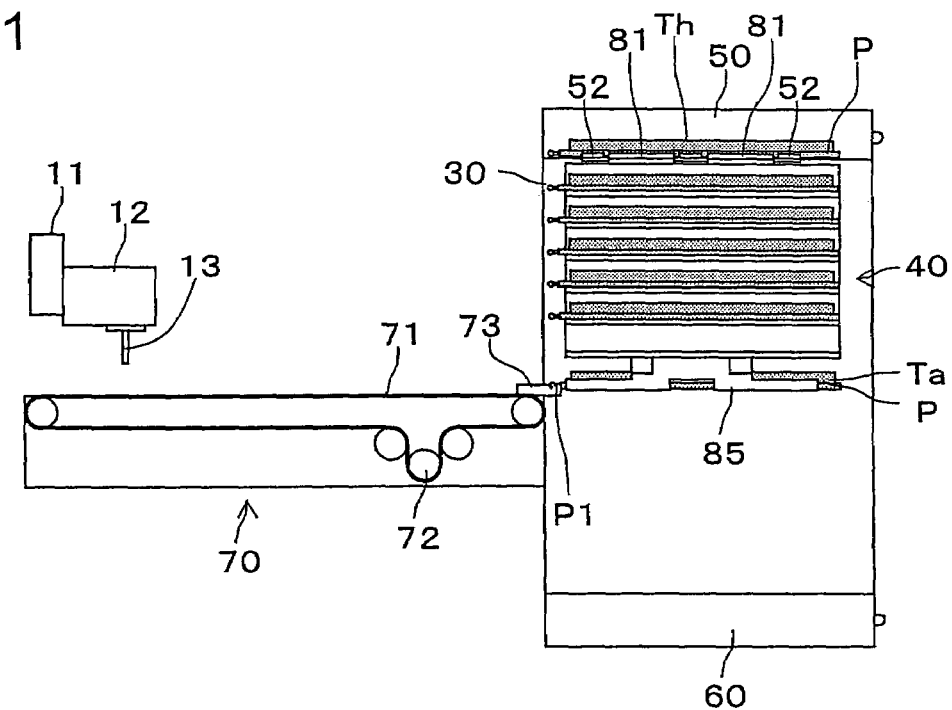
FIG. 11 is an explanatory view for explaining the operation of the tray component supply apparatus according to the present invention.

As shown in FIG. 10, after picking up the last remaining component on the component supply tray T, the tray component supply apparatus 20 elevates and positions the tray stocker 40 so that the empty tray holding members 85 take the same height as the tray mounting table 70, and moves the pallet coupling portion 73, whereby the component supply tray T which has become empty at the component delivery position, that is, empty tray Ta (shown by the two-dot-chain line in the drawing) is stored on the empty tray holding members 85 being in the holding sate.

Next, the tray component supply apparatus 20 transfers the replenishment tray Th stored in the main body side replenishment tray holding section 50 to the tray stocker side replenishment tray holding section 80. That is, the tray stocker 40 with the empty tray Ta held thereby is moved upward to be positioned to a position (the elevated end position) where the tray stocker side replenishment tray holding section 80 comes close to the main body side replenishment tray holding section 50. At this time, the first and second replenishment tray holding members 52, 81 simultaneously hold the same replenishment tray Th. Then, the tray component supply apparatus 20 transfers the replenishment tray Th held by the first replenishment tray holding members 52 to the second replenishment tray holding members 81 by moving the first replenishment tray holding members 52 being in the holding state to the holding release state by the operations of the actuators 94. Accordingly, the transfer of the replenishment tray Th from the first replenishment tray holding members 52 to the second replenishment tray holding members 81 can be done smoothly, so that it can be realized to suppress the vibration of the replenishment tray Th during the transfer motion.

Figure 12:
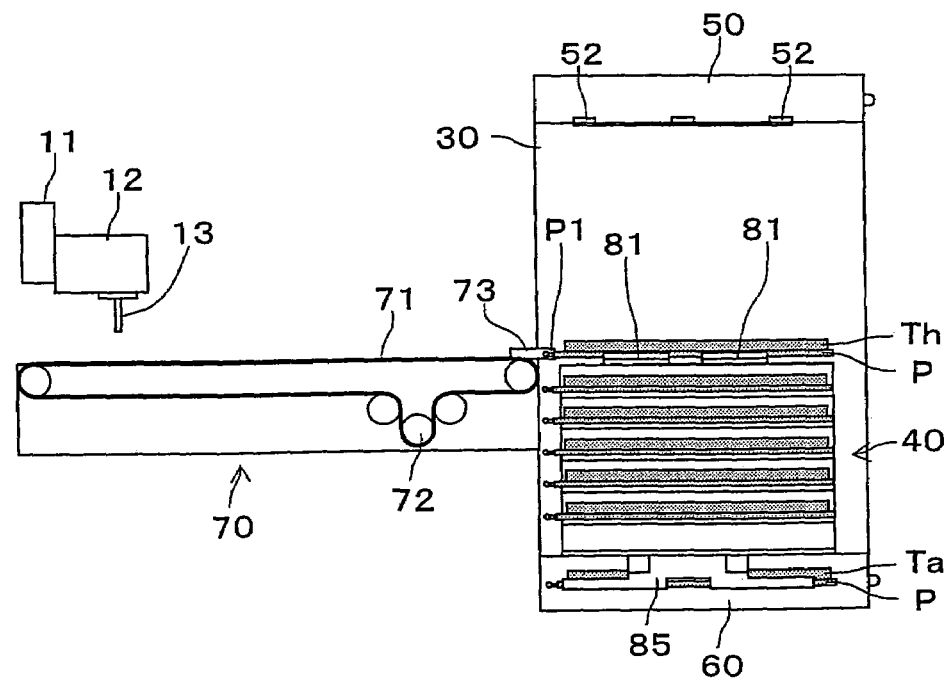
FIG. 12 is an explanatory view for explaining the operation of the tray component supply apparatus according to the present invention.
Figure 13:
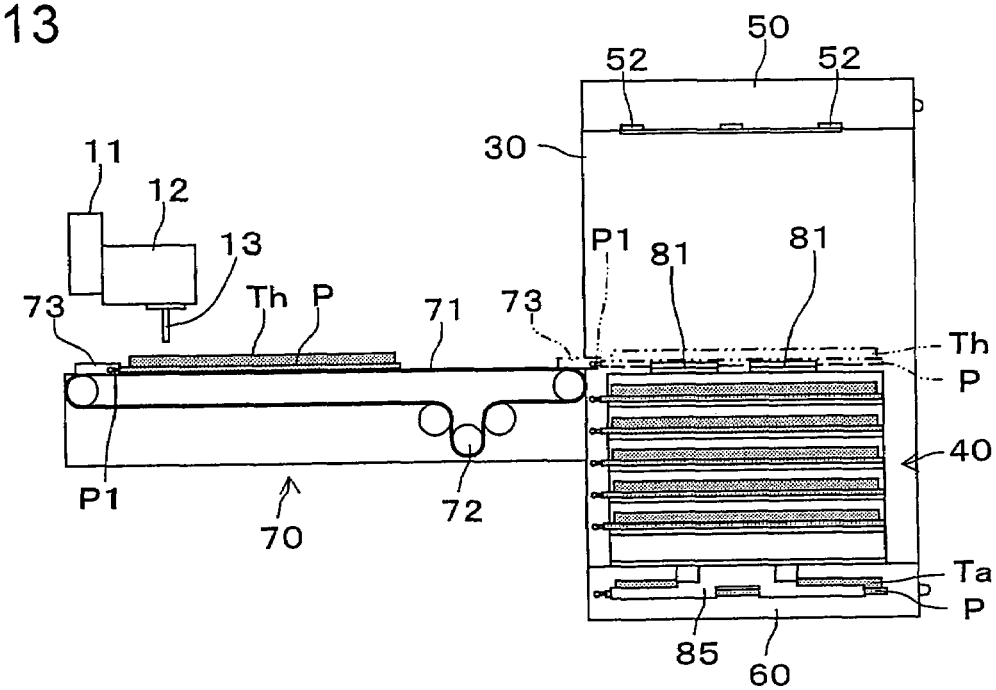
FIG. 13 is an explanatory view for explaining the operation of the tray component supply apparatus according to the present invention.

Then, when requested by the electronic component mounting apparatus 10 for the components on the replenishment tray Th, as shown in FIG. 12, the tray component supply apparatus 20 moves down the tray stocker 40 with the replenishment tray Th and the empty tray Ta held thereby and fixedly positions the tray stocker 40 to a position where the pallet P mounting the replenishment tray Th thereon, that is, the second replenishment tray holding members 81, come to the same height as the tray mounting table 70. Then, the pallet coupling portion 73 is moved to move the pallet P (indicated by the two-dot-chain line in FIG. 13) held by the second replenishment tray holding members 81 to the component delivery position on the tray mounting table 70 (refer to FIG. 13).

Figure 14:
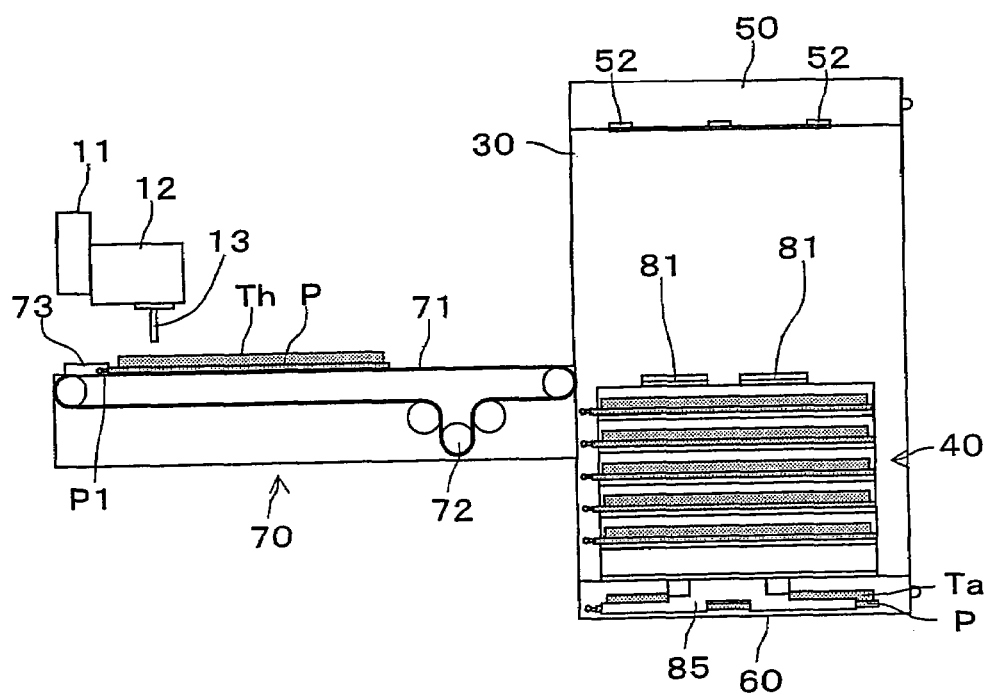
FIG. 14 is an explanatory view for explaining the operation of the tray component supply apparatus according to the present invention.

Subsequently, as shown in FIG. 14, the tray component supply apparatus 20 moves down the tray stocker 40 with the empty tray Ta held thereby and fixedly positions the tray stocker 40 to a position (lower end position) where the empty tray holding members 85 come close to the tray discharge section 60. Then, the tray component supply apparatus 20 drives the actuators 91 to bring the empty tray holding members 85 holding the empty tray Ta into the holding release state, whereby the empty tray Ta is moved (to fall down) onto the tray discharge section 60.

Figure 15:
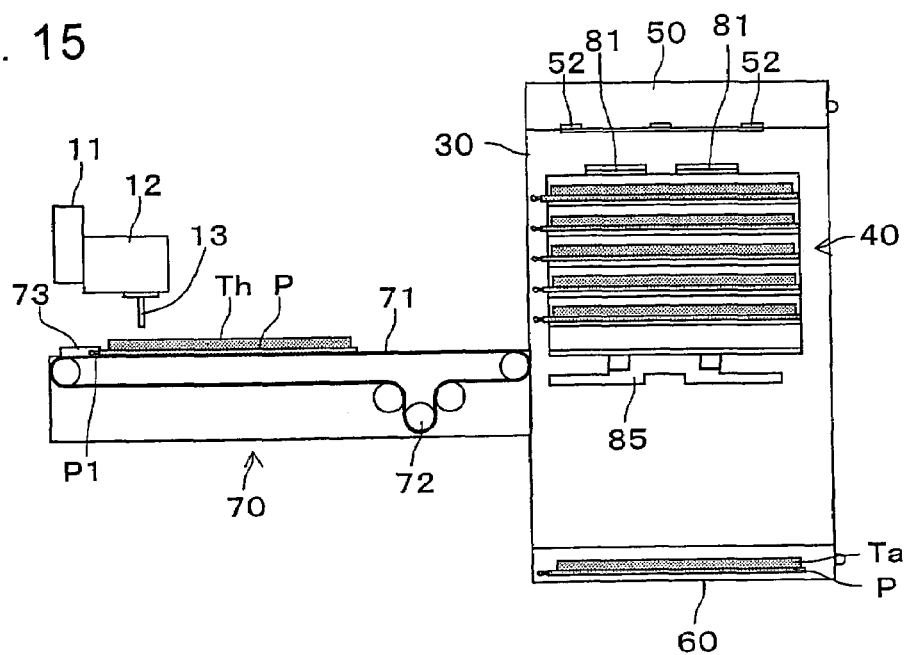
FIG. 15 is an explanatory view for explaining the operation of the tray component supply apparatus according to the present invention.
Figure 16:
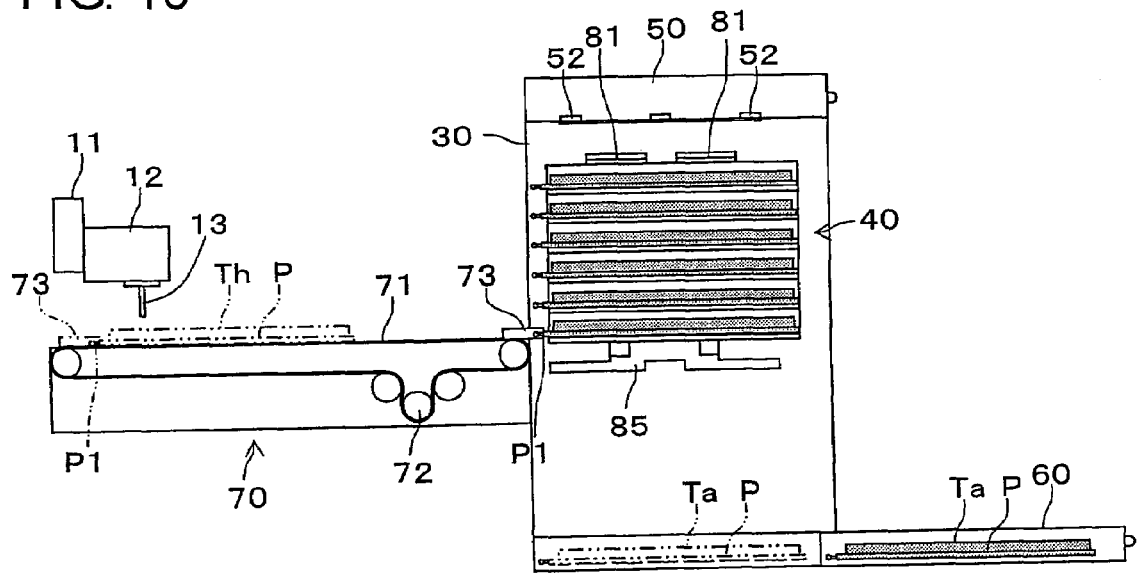
FIG. 16 is an explanatory view for explaining the operation of the tray component supply apparatus according to the present invention.

Next, as shown in FIG. 15, the tray component supply apparatus 20 moves the tray stocker 40 upward and fixedly positions the same to a position where a storage location for the pallet P being mounted on the tray mounting table 70 takes the same height as the tray mounting table 70. Then, the tray component supply apparatus 20 moves the pallet coupling portion 73 on the tray mounting table 70 to the predetermined position in the main body 30 of the tray component supply apparatus 20 to store the component supply tray T at the location of the tray stocker 40 where it was. Further, the worker draws out the tray discharge section 60 holding the empty tray Ta, takes the same therefrom, and returns the tray discharge section 60 into the main body 30. The aforementioned discharge of the empty tray Ta can be done without moving the tray stocker 40 up and down and without moving the component supply tray T on the tray mounting table 70 to and from the tray stocker 40.

Having known the component supply trays T (component kinds), the pallets P and the storage locations therefor of the tray stocker 40 in correlation therebetween, the tray component supply apparatus 20 is able to draw the component supply tray T having become empty out of the tray stocker 40 and store the replenishment tray Th at the storage location having become empty. Thus, it is possible to automatically set necessary components on the tray component supply apparatus 20.

Figure 17:
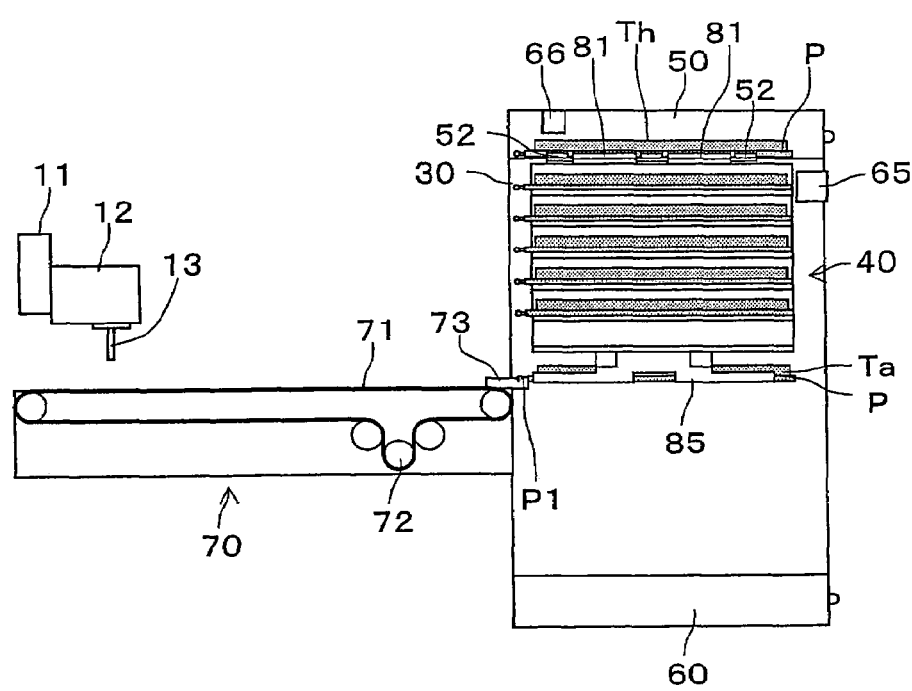
FIG. 17 is an explanatory view for explaining the operation of the tray component supply apparatus according to the present invention.

Further, as shown in FIG. 17, the tray component supply apparatus 20 is provided with the barcode reader 65 or a camera 66, so that it can recognize the kinds of the component supply trays T mounted on the pallets P and hence, the kinds of the components stored in the component supply trays T. The barcode reader 65 is secured to an upper part of the main body 30 and reads the barcode seal P3 affixed to the back surface of the upright portion P2 upwardly protruding from the rear end of each pallet P, during the downward movement of the pallets P. The kinds of the components can be recognized as the result of such reading. The camera 66 is secured to an upper part in the main body side replenishment tray holding section 50 and directly takes the pictures of the components to recognize the kinds of the components by reference to component numbers put on the components.

As understood from the foregoing description, in this embodiment, the main body side replenishment tray holding section 50 for externally receiving and holding the replenishment tray Th is provided at the upper part of the main body 30, and it is possible to transfer the replenishment tray Th held by the main body side replenishment tray holding section 50 to the tray stocker side replenishment tray holding section 80 with the tray stocker side replenishment tray holding section 80 positioned to a position close to the main body side replenishment tray holding section 50. The tray discharge section 60 for holding the empty tray Ta and for discharging the empty tray Ta is provided at the lower part of the main body 30, and an empty tray holding member moving means composed of the actuators 91 and the engaging portions 92 transfers the empty tray Ta held by the empty tray holding members 85 to the tray discharge section 60. Accordingly, it can be realized to provide the tray component supply apparatus which is made to be compact without enlarging the apparatus in the lateral direction. Further, since the empty tray Ta held by the empty tray holding members 85 is transferred to the tray discharge section 60 by falling down, the construction can be simplified.

Further, in the foregoing embodiment, the replenishment tray Th held by the tray stocker side replenishment tray holding section 80 is stored in a predetermined location in the tray stocker 40 after being drawn out once onto the tray mounting table 70. With this construction, since the tray mounting table 70 is utilized as a location for a temporary turnout, it can be realized to store the replenishment tray Th held by the tray stocker side replenishment tray holding section 80 at the predetermined location in the tray stocker 40 without providing an additional turnout. Consequently, it can be realized to make the apparatus compact.

Further, in the foregoing embodiment, the empty tray holding member moving means composed of the actuators 91 and the engaging portions 92 is provided beside the tray discharge section 60 and serves for moving the empty tray holding members 85 to the holding release position when the tray stocker 40 is moved down to make the empty tray holding members 85 come close to the tray discharge section 60. With this construction, when the empty tray holding members 85 holding the empty tray Ta are brought close to the tray discharge section 60, the empty tray Ta being held can be transferred to the tray discharge section 60 automatically and reliably.

Although in the foregoing embodiment, the main body side replenishment tray holding section 50 and the tray discharge section 60 are provided respectively at the upper part and the lower part of the main body 30, the main body side replenishment tray holding section 50 and the tray discharge section 60 may be provided respectively at the lower part and the upper part of the main body 30. In this case, an empty tray holding section for holding an empty tray Ta is provided on the top plate 44 of the tray stocker 40, a tray stocker side replenishment tray holding section for holding the replenishment tray Th is provided on the bottom plate 43, and there are further provided empty tray transfer means for transferring the empty tray held by the empty tray holding section to the tray discharge section 60 and transfer means for transferring the replenishment tray held by the main body side replenishment tray holding section to the tray stocker side replenishment tray holding section. Also with this construction, it can be realized to provide the tray component supply apparatus which is made to be compact without enlarging the apparatus in the lateral direction.

Further, although in the foregoing embodiment, the main body side replenishment tray holding section 50 is constructed to be of the drawer type, a modification may be made to make the top plate 31*f* of the main body opened and closed and to store the replenishment tray Th through the opening. In this case, the frame member 51 is bodily provided at the upper part of the main body 30, the top plate 31*f* of the main body 30 is constructed to be opened and closed, and the replenishment tray Th may be replenished with the top plate 31*f* opened. With this construction, since the replenishment tray Th is stored inside the main body 30 with the top plate 31*f* opened, one can easily replenish the replenishment tray Th.

2) Second Embodiment

Figure 18:
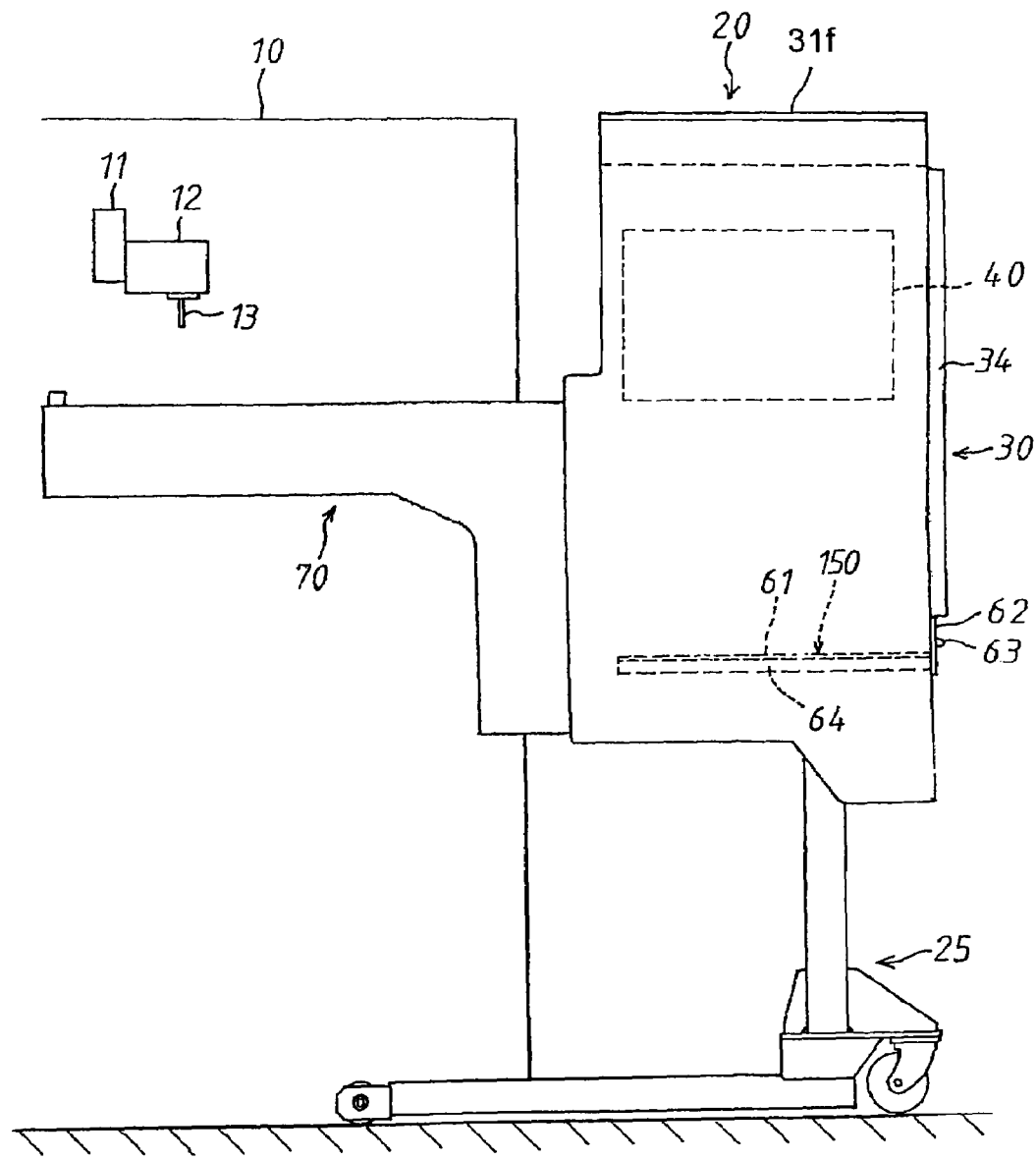
FIG. 18 is a left side elevational view of a tray component supply apparatus in a second embodiment according to the present invention.

Next, a tray component supply apparatus in a second embodiment according to the present invention will be described with reference to the drawings. FIG. 18 is a left side elevational view of the tray component supply apparatus placed beside an electronic component mounting apparatus. In the foregoing first embodiment, the main body side replenishment tray holding section 50 and the tray discharge section 60 are provided respectively at the upper and lower parts of the main body 30, and the tray stocker side replenishment tray holding section 80 and the empty tray holding members 85 are provided respectively at the upper and lower parts of the tray stocker 40, so that it can be realized to replenish the replenishment tray Th at the upper part of the main body 30 of the tray component supply apparatus 20 and to take the empty tray Ta from the lower par of the main body 30. In the second embodiment, however, a main body side replenishment tray holding section 150 and main body side empty tray holding sections 160 are provided respectively at the lower part and the upper part of the main body 30, tray stocker side replenishment tray holding sections 180 and tray stocker side empty tray holding sections 170 are provided respectively at the lower part and the upper part of the tray stocker 40, so that it can be realized to replenish the replenishment tray Th at the lower part of the main body 30 and to take the empty tray Ta from the upper part of the main body 30. Hereinafter, description will be made only regarding the construction which differs from that in the foregoing first embodiment, and description will be omitted regarding the same construction.

Figure 19:
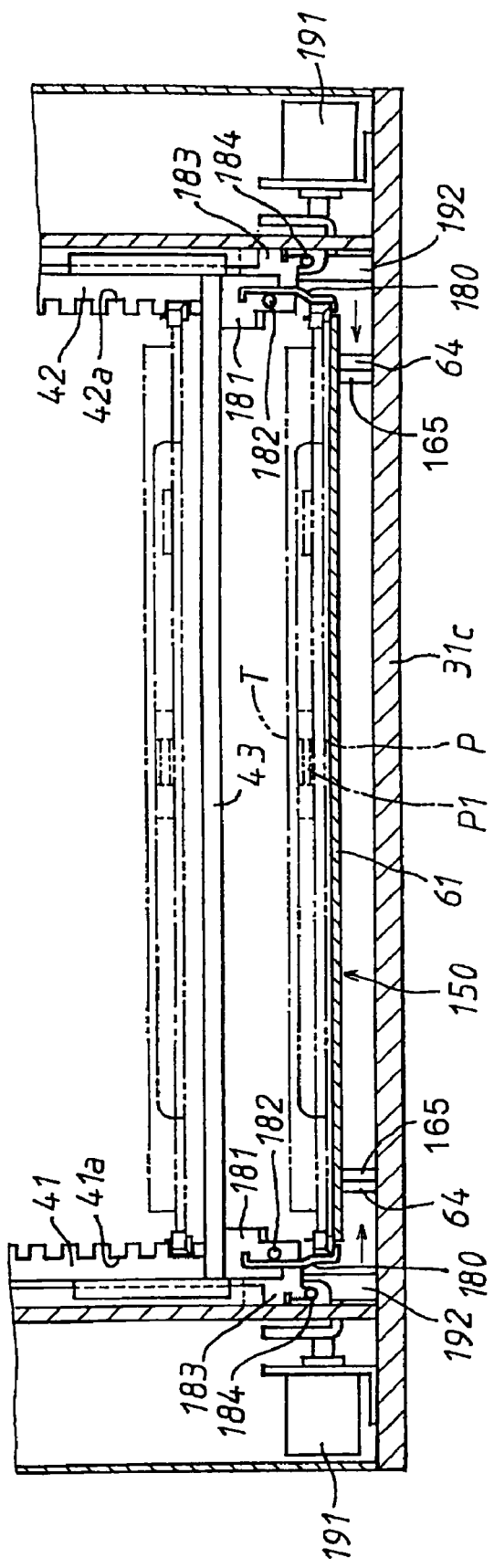
FIG. 19 is a front view showing the interior structure of a main body shown in FIG. 18 and particularly, the lower parts of the main body and a tray stocker.

As shown in FIGS. 18 and 19, the main body side replenishment tray holding section 150 is provided at a lower part under the tray stocker 40 of the main body 30. The main body side replenishment tray holding section 150 is provided to be capable of being drawn horizontally (in the front-rear direction) so that it can hold the replenishment tray Th and can discharge the same out. The main body side replenishment tray holding section 150 is formed to be rectangular and is provided with a tray-like receiving plate 61 for holding the replenishment tray Th at an upper surface thereof and a rear plate 62 protruding upward from the rear end of the receiving plate 61. The lower surface of the receiving plate 61 has attached thereto a pair of rails 165, 165, which are slidable by being guided along a pair of rails 64, 64 attached to the upper surface of the bottom plate 31*c* of the housing 31. Also, the rear plate 62 is provided with a grip 63.

Figure 20:
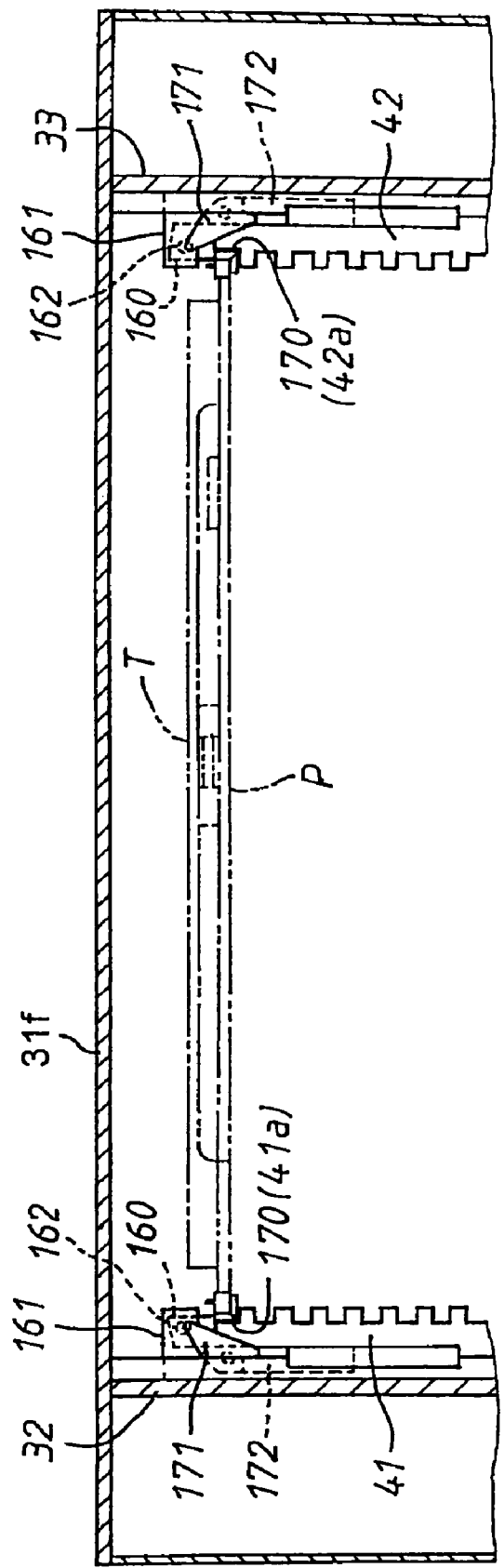
FIG. 20 is a front view showing the interior structure of the main body shown in FIG. 18 and particularly, the upper parts of the main body and a tray stocker.
Figure 21:
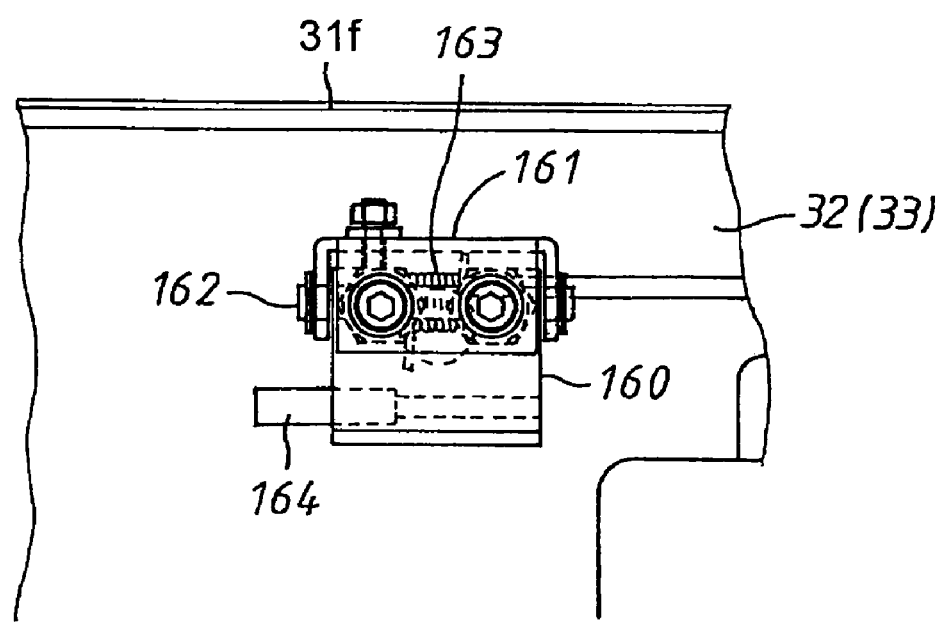
FIG. 21 is an enlarged fragmentary view showing the neighborhood of a main body side empty tray holding section shown in FIG. 20.

As shown in FIGS. 20 and 21, the main body side empty tray holding sections (empty tray holding members) 160 are provided at an upper part over the tray stocker 40 of the main body 30. The main body side empty tray holding sections 160 are movable between a holding position for holding the empty tray Ta and a holding release position for releasing the holding. The pair of main body side empty tray holding sections 160 are slender with a hook-like cross-section and are mounted to be swingable about support shafts 162 which are provided at the upper parts of the left and right frame sections 32, 33 through support members 161, and are arranged to be spaced and mutually parallel on straight lines extending in the front-rear direction (in the direction normal to the drawing seat in FIG. 20). Further, the main body side empty tray holding sections 160 are provided with pins 164 which cooperate with an empty tray holding member moving means 171 referred to later.

Figure 24:
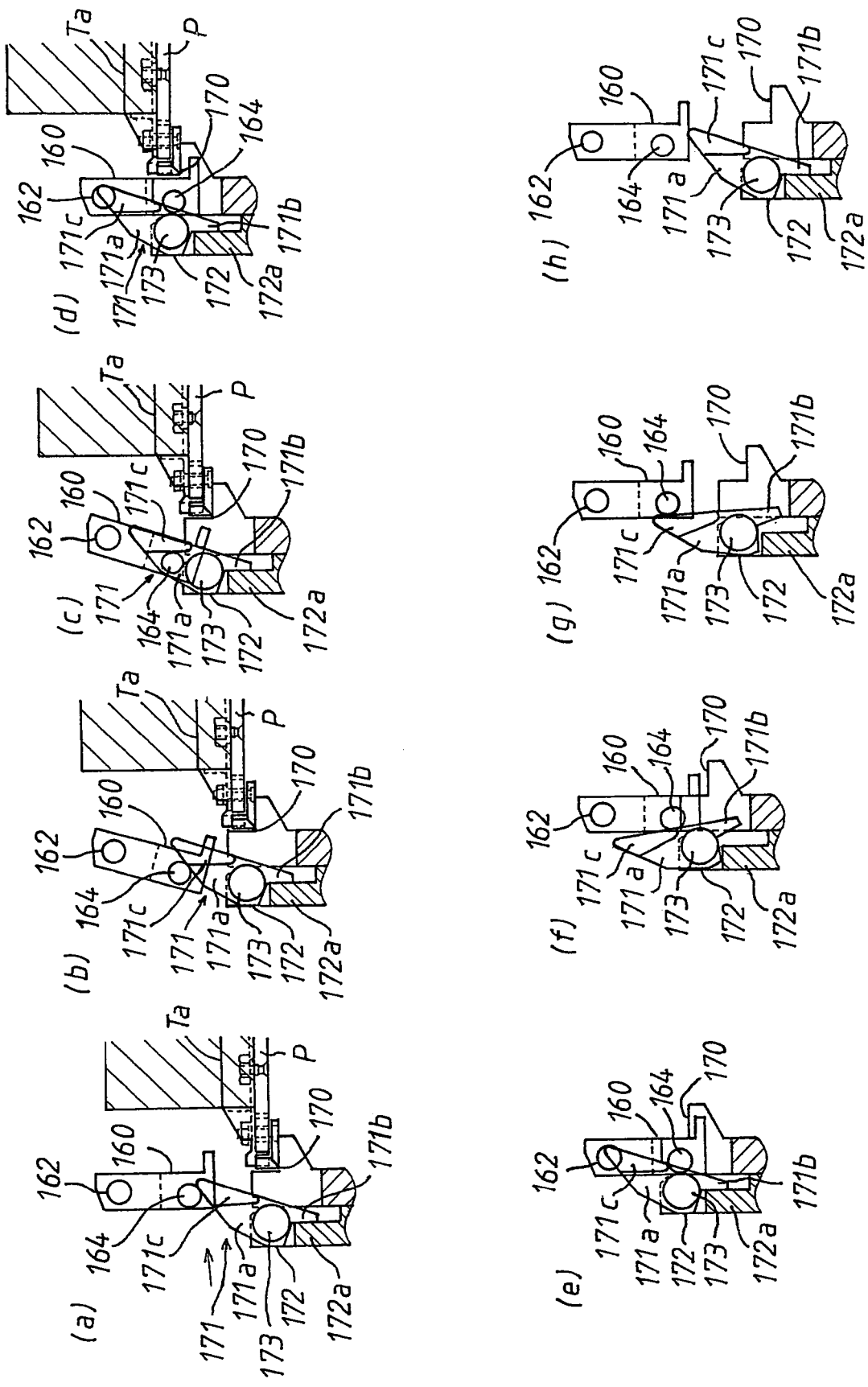
FIG. 24 is a series of explanatory views for explaining the operations of the main body side empty tray holding section and a tray stocker side empty tray holding section shown in FIG. 20.

Torsion coil springs 163 fitted around the support shafts 162 are interposed between the main body side empty tray holding sections 160 and the support members 161, and the main body side empty tray holding sections 160 are urged inward by the springs 163 (in the direction indicated by the arrow in FIG. 24). The main body side empty tray holding sections 160 being urged are restricted by stops (not shown) from being rotated thereby to be kept in the holding state (indicated by the solid line in FIG. 24(*a*)) for holding the empty tray Ta to be slidable. Both of the main body side empty tray holding sections 160 provided at the upper parts of the left and right frame sections 32, 33 are arranged to face with each other in the aforementioned holding state and hold the pallet P while positioning the same in the left-right direction (the left-right direction in FIG. 24). The empty tray Ta being held can be taken out from the main body side empty tray holding sections 160 when lifted upward.

As shown in FIG. 19, the replenishment tray holding members 180 which are tray stocker side replenishment tray holding sections are provided at a lower part of the tray stocker 40, more specifically at the lower surface of the bottom plate 43 of the tray stocker 40. The tray stocker side replenishment tray holding members 180 are slender with a hook-like cross-section, are mounted to be swingable respectively about support shafts 182 at the left and right end parts of the bottom plate 43 of the tray stocker 40 through support members 181 secured to the bottom plate 43, and are arranged to be mutually parallel respectively along straight lines extending in the front-rear direction (in the direction normal to the drawing sheet in FIG. 19).

Torsion coil springs (not shown and being springs similar to the torsion coil springs 88 shown in FIG. 3) fitted around the support shafts 182 are interposed between the replenishment tray holding members 180 and the support members 181, and the replenishment tray holding members 180 are urged by the springs inward (in the direction indicated by the arrow in FIG. 19). The replenishment tray holding members 180 being urged are restricted by stops (not shown) from being rotated thereby to be kept in a holding state (indicated by the solid line in FIG. 19) for holding the replenishment tray to be slidable. Both of the replenishment tray holding members 180 provided at the left and right parts of the bottom plate 43 of the tray stocker 40 are arranged to face with each other in the aforementioned holding state and hold the pallet P to be slidable in the front-rear direction (in the direction normal to the drawing sheet in FIG. 19) while positioning the pallet P in the left-right direction (in the left-right direction in FIG. 19).

Figure 22:
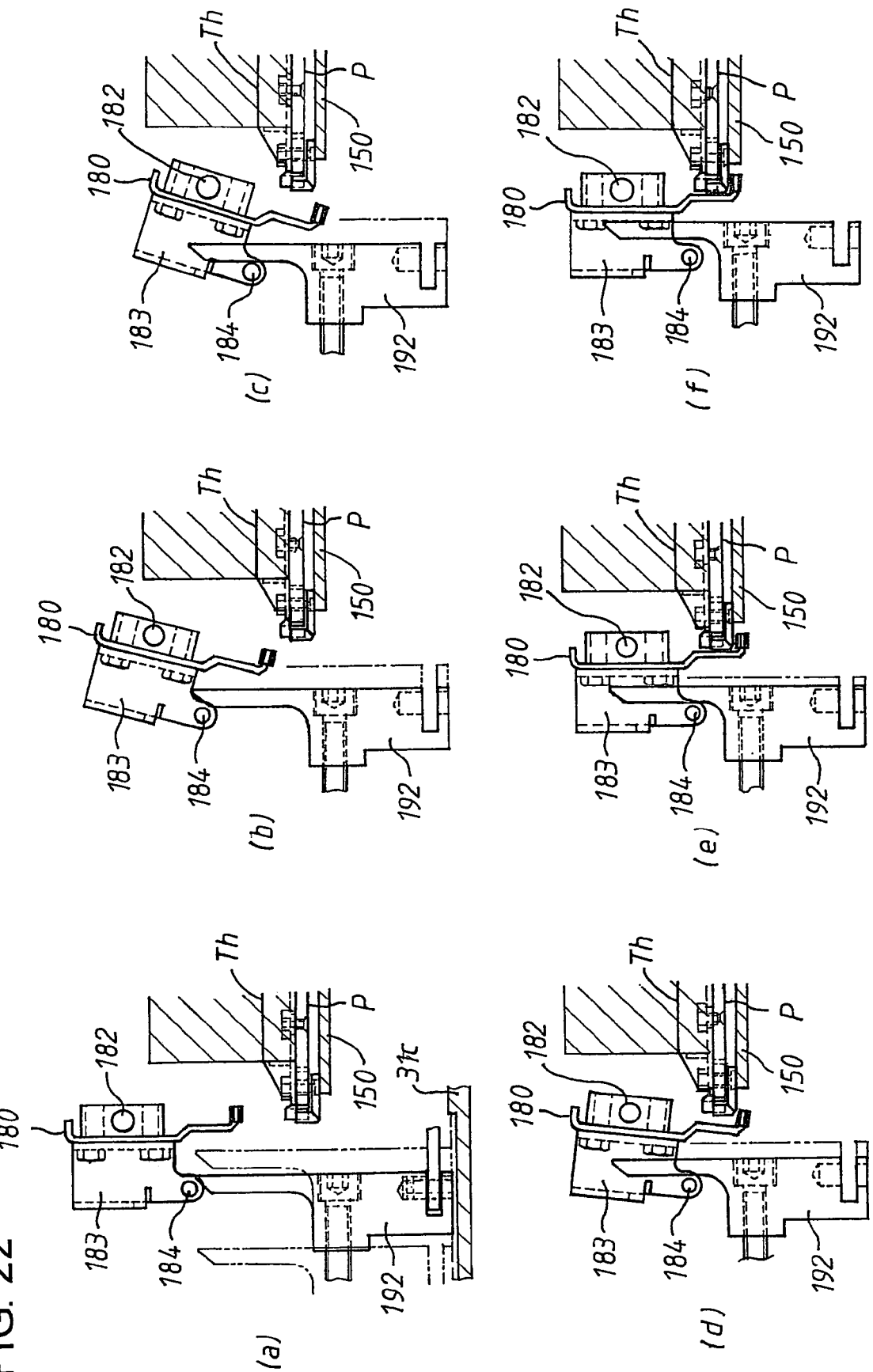
FIG. 22 is a series of explanatory views for explaining the operations of replenishment tray holding members and the main body side replenishment tray holding section shown in FIG. 19.

As shown in FIGS. 19 and 22, engaging portions 184 are secured to respective outside wall surfaces of the replenishment tray holding members 180 by means of brackets 183. The engaging portions 184 are engageable with engaging portions 192 coupled to actuators 191, respectively. When the engaging portions 192 are moved outwards upon operation of the actuators 191, the engaging portions 192 are brought into engagement with the engaging portions 184, and the engaging portions 184 are also moved outwards. Thus, the replenishment tray holding members 180 are expanded outwards and are moved to holding release positions (the positions shown in FIGS. 22(b) and 22(c)) thereby to release the holding of the replenishment tray Th. FIG. 22(a) shows the operational state wherein the tray stocker 40 is moved down, and FIGS. 22(b) and 22(c) well depict the opened state of the replenishment tray holding members 180 with the replenishment tray holding members 180 and the pallet P being at different heights.

With reference to FIG. 22, description will be made regarding the operation which the aforementioned replenishment tray holding members 180 perform to hold the replenishment tray Th held by the main body side replenishment tray holding section 150. Each engaging portion 192 is basically positioned at a base position indicated by the left side two-dot-chain line in FIG. 22(a) and is selectively positioned and fixed to the base position and an innermost position (holding position) indicated by the right side two-dot-chain line in FIG. 22(a) through movement therebetween. When moved to hold the replenishment tray Th held by the main body side replenishment tray holding sections 150, each engaging portion 192 is moved to the holding release position (indicated by the solid line in FIG. 22) where the engaging portion 184 comes into abutment with the tip of the engaging portion 192.

When the down movement of the tray stocker 40 causes the engaging portion 184 to come into abutment with the tip of the engaging portion 192, the engaging portion 184 is moved outward along a slant surface at the tip of the engaging portion 192, and with this movement, each replenished holding member 180 is opened outward against the urging force of the torsional coil spring (refer to FIG. 22(b)). It has been set that at this time, each replenished holding member 180 is opened to the extent that its lower end does not hit on the pallet P. Then, with the state being kept, the engaging portion 184 is moved down to a predetermined height along an outside wall surface of the engaging portion 192 (refer to FIGS. 22(c) and 22(d)). When the engaging portion 184 is moved down to the predetermined height (transfer height), the engaging portion 192 is moved inward (refer to FIG. 22(e)), which allows the engaging portion 184 to be moved to the innermost position (holding position) by the urging force of the torsion coil spring (refer to FIG. 22(f)). Thus, the replenishment tray holding members 180 simultaneously hold the replenishment tray Th held by the main body side replenishment tray holding section 150. When the tray stocker 40 is moved upward with each engaging portion 192 remaining at the position shown in FIG. 22(f), the replenishment tray Th held by the main body side replenishment tray holding section 150 is transferred onto the replenishment tray holding members 180. With this construction, it can be realized reliably in a simplified construction to transfer the replenishment tray Th held by the main body side replenishment tray holding section 150 to the replenishment tray holding members 180. It is to be noted that the transfer height is defined as the height at which the replenishment tray holding members 180 simultaneously hold the replenishment tray Th held by the main body side replenishment tray holding section 150.

The following operation will be performed where the replenishment tray holding members 180 return the replenishment tray Th held by the replenishment tray holding members 180 to the main body side replenishment tray holding section 150 for the reason that a wrong replenishment tray Th is held by the replenishment tray holding members 180 or that the replenishment tray Th held by the replenishment tray holding members 180 has wrong components loaded thereon. The engaging portion 192 is moved to the holding position shown in FIG. 22(f) when the tray stocker 40 is moved down. When the tray stocker 40 is moved down to the transfer position, the engaging portion 192 is moved outward to come to engagement with the engaging portion 184, and thus, the engaging portion 184 is also moved outward. Thus, each replenishment tray holding member 180 is opened outward to be moved to the holding release position and releases the holding of the replenishment tray Th. Then, the tray stocker 40 is moved upward with the engaging portion 192 remaining in that position and with the replenishment tray holding section 180 remaining opened. Thereafter, as described later, the main body side empty tray holding section 160 is drawn out, and the replenishment tray Th is taken out.

As shown in FIG. 20, the tray stocker side empty tray holding sections 170 are formed at an upper part of the tray stocker 40 and specifically, are constituted by the uppermost guide slots 41a, 42a of the tray stocker 40. The top plate 44 as used in the first embodiment is removed from the tray stocker 40 in the second embodiment.

Figure 23:
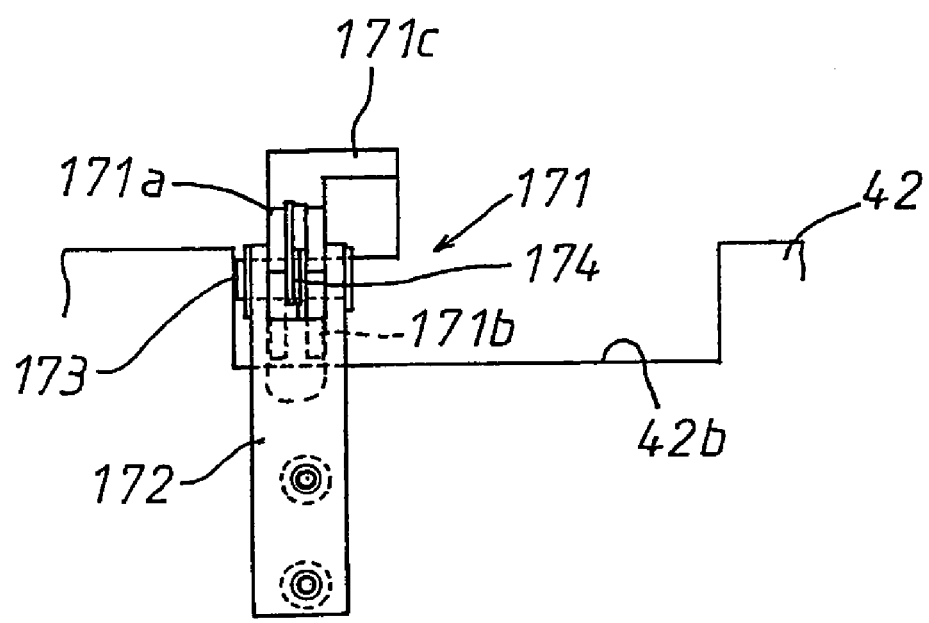
FIG. 23 is an enlarged fragmentary view showing the neighborhood of an empty tray holding member moving means shown in FIG. 20.

As shown typically in FIG. 23, the upper end edges of the left and right side plates 41, 42 of the tray stocker 40 have formed a pair of cutouts 42b (the cutout on the left side plate 41 is not shown) at portions corresponding to the main body side empty tray holding sections 160 for use as turnouts for the main body side empty tray holding sections 160, and a pair of empty tray holding member moving means 171 are provided at the portions corresponding to the main body side empty tray holding sections 160, through attaching members 172, respectively. The empty tray holding member moving means 171 move the main body side empty tray holding sections 160 between the holding position for holding the empty tray Ta and the holding release position for releasing the holding, so that the empty tray Ta held by the main body side empty tray holding sections 160 is moved to the tray stocker side empty tray holding sections 170.

Each empty tray holding member moving means 171 has a main body 171a, a stop 171b and a cam 171c which are formed bodily. Each empty tray holding member moving means 171 is attached to an attaching member 172 through a support shaft 173 to be pivotable about the support shaft 173. A torsion coil spring 174 fitted around the support shaft 173 is interposed between each empty tray holding member moving means 171 and the attaching member 172, and each empty tray holding member moving means 171 is urged by the spring 174 inward (in the direction indicated by the arrow in FIG. 24(a)). Each empty tray holding member moving means 171 being urged remains at a restricted position (indicated by the solid line in FIG. 24(a)) with the stop 171b restricted from being rotated by a rotation restricting portion 172a provided on the attaching member 172.

With reference to FIG. 24, description will be made regarding the operation which the aforementioned main body side empty tray holding sections 160 perform to hold the empty tray Ta held by the tray stocker side empty tray holding sections 170. Until the tray stocker 40 reaches the transfer position for the empty tray Ta, each empty tray holding member moving means 171 remains at the restricted position, and the main body side empty tray holding sections 160 remain in the holding position. When the tray stocker 40 is further moved upward, the pin 164 comes to abut with an upper slant surface of the cam 171c, in which case since each empty tray holding member moving means 171 is restricted from pivoting clockwise, the pin 164 is moved along the upper slant surface of the cam 171c, whereby each main body side empty tray holding section 160 is opened outward (refer to FIGS. 24(a) and 24(b)). As the tray stocker 40 is further moved upward, the pin 164 is moved along a vertical surface continuing to the slant surface of the cam 171c and keeps the main body side empty tray holding section 160 in the opened state (the holding release position) (refer to FIG. 24(c)). When further upward movement of the tray stocker 40 causes the pin 164 to terminate the movement along the vertical surface of the cam 171c, each main body side empty tray holding section 160 is returned by the urging force of the torsion coil spring 163 to the holding portion (refer to FIG. 24(d)). Subsequently, when the tray stocker 40 is moved down, the empty tray Ta held by the tray stocker side empty tray holding sections 170 is transferred to the main body side empty tray holding sections 160. With this construction, the tray stocker side empty tray holding sections 170 holding the empty tray Ta come close to the main body side empty tray holding sections 160, the empty tray Ta being held is transferred to the main body side empty tray holding sections 160 automatically and reliably. While the pin 164 comes to abut with a lower side slant surface of the cam 171c in the down movement of the tray stocker 40, each main body side empty tray holding section 160 is prevented from pivoting counterclockwise, whereby the pin 164 is moved along the lower side slant surface of the cam 171c to make the empty tray holding member moving means 171 open outward (refer to FIGS. 24(e) through 24(h)).

Next, the operation of the tray component supply apparatus 20 as constructed above will be described with reference to FIG. 25 to FIG. 33. Upon receiving information regarding the components to be mounted from the electronic component mounting apparatus 10, the tray component supply apparatus 20 moves the pallet coupling portion 73 on the tray mounting table 70 to a predetermined position (indicated by the two-dot-chain line in FIG. 25) in the main body 30 of the tray component supply apparatus 20 and moves the tray stocker 40 up and down so that a pallet P (the pallet P stored in the lowermost step also in the second embodiment) mounting thereon a component supply tray T which is loaded with the components to be mounted is fixedly positioned at the same height as the tray mounting table 70. At this time, the T-letter shape grip portion P1 of the pallet P is inserted to be gripped into the T-letter shape cutout formed in the pallet coupling portion 73. It is to be noted that during the upper and down movement, the T-letter shape grip portion P1 of the pallet P is in the grip release state and passes through the cutout. Then, the pallet coupling portion 73 is moved to move the pallet P (shown by the two-dot-chain line in FIG. 25) within the tray stocker 40 to the component delivery position on the tray mounting table 70 (refer to FIG. 25). The component delivery position is within the moving area for the suction nozzle 13 of the electronic component mounting apparatus 10. Then, the suction nozzle 13 picks up the components and mounts the same on a board.

On the other hand, the electronic component mounting apparatus 10 has known the number of used components and the number of components remaining and when the number of the components remaining becomes a few, issues an alert for replenishing the components which have become a few. In response to this alert, a worker stores in the main body side replenishment tray holding section 150 a pallet P mounting a replenishment tray Th which has stored the components therein. That is, the worker draws the main body side replenishment tray holding section 150 out, places the replenishment tray Th at a predetermined position on the upper surface of the receiving plate 61 (indicated by the two-dot-chain line in FIG. 26), and returns the main body side replenishment tray holding section 150 into the main body 30 (indicated by the solid line in FIG. 26). Then, the worker pushes a switch (not shown) to inform the tray component supply apparatus 20 and hence, the electronic component mounting apparatus 10 as to the completion of the storage. Since the foregoing replenishment of the component supply tray T is such that the main body side replenishment tray holding section 150 is drawn out horizontally and is returned into the main body 30 after a replenishment tray Th is stored therein, one can easily replenish the replenishment tray Th. Further, the foregoing replenishment of the component supply tray T can be done without involving any problem in moving the tray stocker 40 up and down as well as in moving the component supply tray T on the tray mounting table 70 to and from the tray stocker 40.

Figure 27:
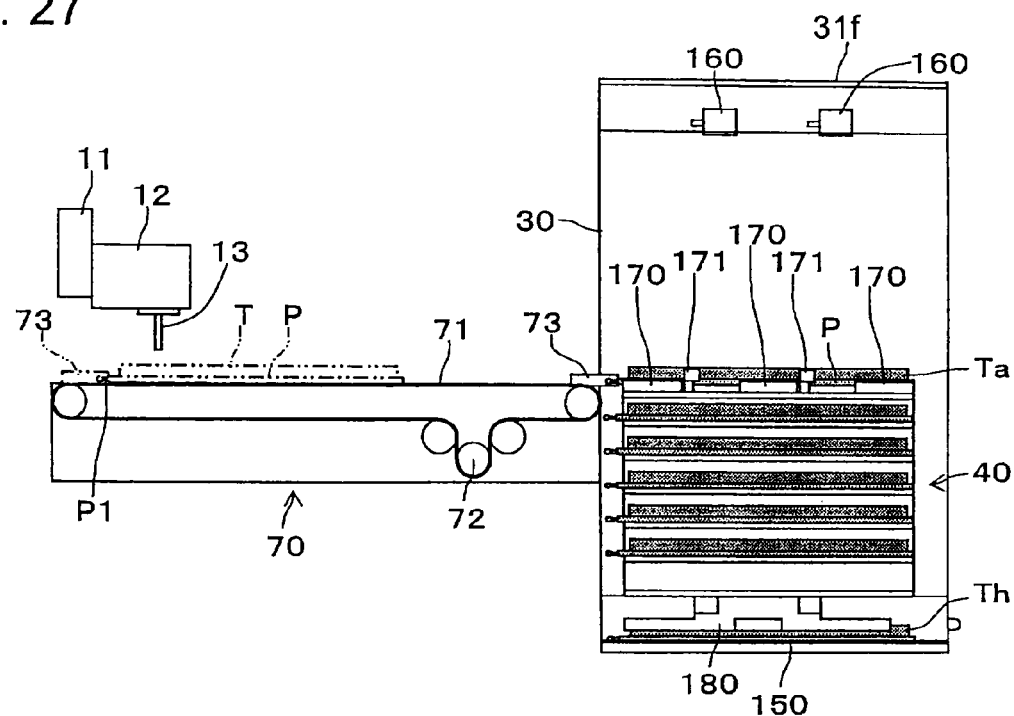
FIG. 27 is an explanatory view for explaining the operation of the tray component supply apparatus according to the present invention.

As shown in FIG. 27, after the last component which remained on the component supply tray T is picked up, the tray component supply apparatus 20 moves down the tray stocker 40 so that the tray stocker side empty tray holding sections 170 take the same height as the tray mounting table 70, and fixedly positions the tray stocker 40 to that position. Then, the tray component supply apparatus 20 moves the pallet coupling portion 73, whereby the component supply tray T which has become empty at the component delivery position, that is, an empty tray Ta (indicated by the two-dot-chain line in the figure) is stored in the empty tray holding sections 170 being in the holding state (as indicated by the solid line in the figure).

Figure 28:
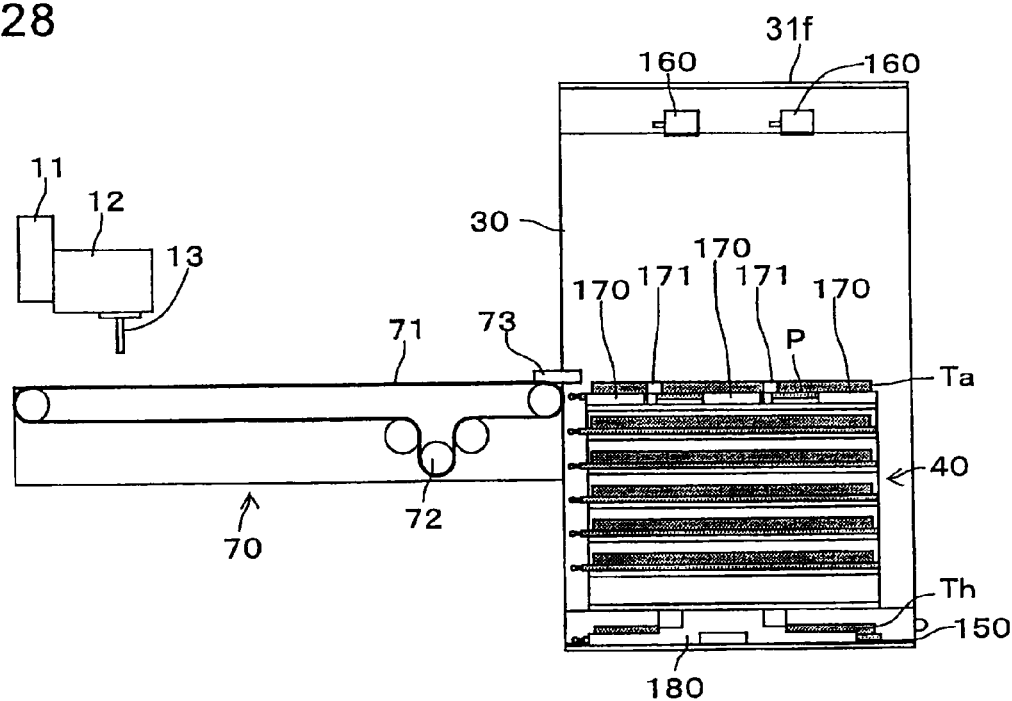
FIG. 28 is an explanatory view for explaining the operation of the tray component supply apparatus according to the present invention.

Next, as shown in FIG. 28, the tray component supply apparatus 20 transfers the replenishment tray Th stored in the main body side replenishment tray holding section 150 to the tray stocker side replenishment tray holding sections 180. That is, the tray stocker 40 with the empty tray Ta held at the tray stocker side empty tray holding sections 170 is moved down to be fixedly positioned to a position (the lower end position being the aforementioned delivery position) where the tray stocker side replenishment tray holding sections 180 come close to the main body side replenishment tray holding section 150. At this time, the tray stocker side replenishment tray holding sections 180 operate as described earlier and, together with the main body side replenishment tray holding section 150, simultaneously hold the same replenishment tray Th. Then, when the tray stocker 40 is moved upward with the engaging portions 192 remaining at the position shown in FIG. 22(f), the replenishment tray Th held by the main body side replenishment tray holding section 150 is transferred to the tray stocker side replenishment tray holding sections 180. Accordingly, the transfer of the replenishment tray Th from the main body side replenishment tray holding section 150 to the tray stocker side replenishment tray holding sections 180 can be done smoothly, so that it can be realized to suppress the vibration of the replenishment tray Th during the transfer motion.

Figure 29:
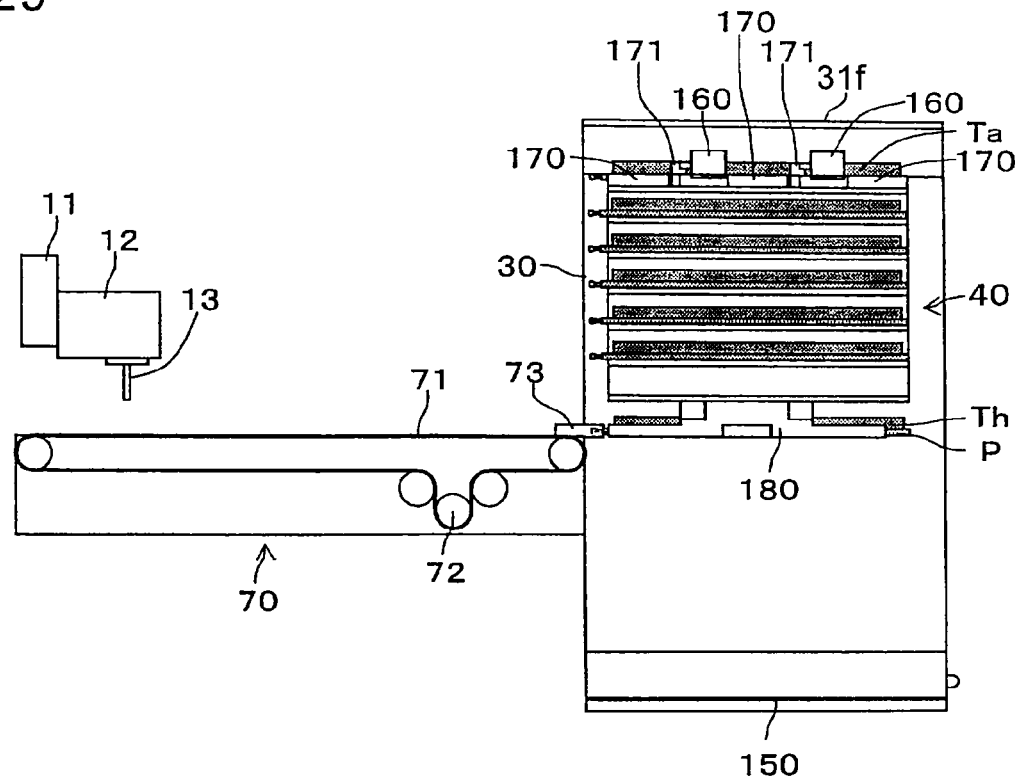
FIG. 29 is an explanatory view for explaining the operation of the tray component supply apparatus according to the present invention.
Figure 30:
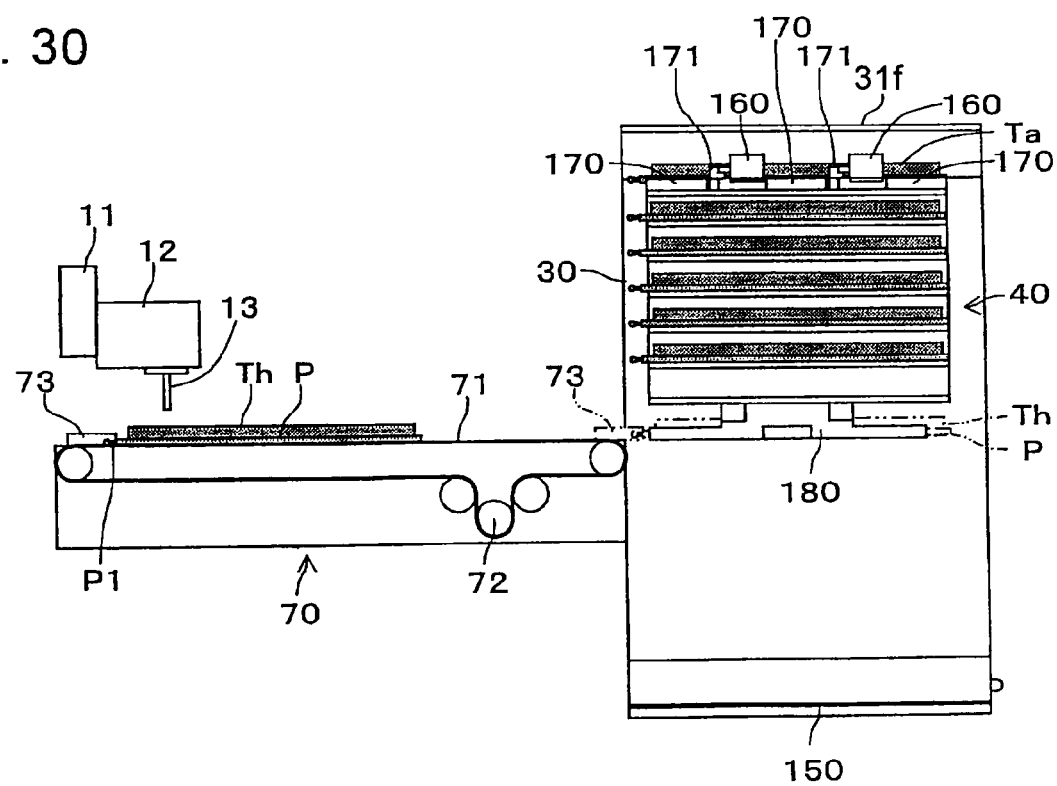
FIG. 30 is a an explanatory view for explaining the operation of the tray component supply apparatus according to the present invention.

Then, when requested by the electronic component mounting apparatus 10 for the components on the replenishment tray Th, the tray component supply apparatus 20 moves the tray stocker 40 upward with the replenishment tray Th and the empty tray Ta held thereby and fixedly positions the tray stocker 40 to a position where the pallet P mounting the replenishment tray Th thereon, that is the tray stocker side replenishment tray holding sections 180 take the same height as the tray mounting table 70, as shown in FIG. 29. Then, the pallet coupling portion 73 is moved to move the pallet P (indicated by the two-dot-chain line in FIG. 30) held by the tray stocker side replenishment tray holding sections 180 to the component delivery position on the tray mounting table 70 (indicated by the solid line in FIG. 30).

Figure 31:
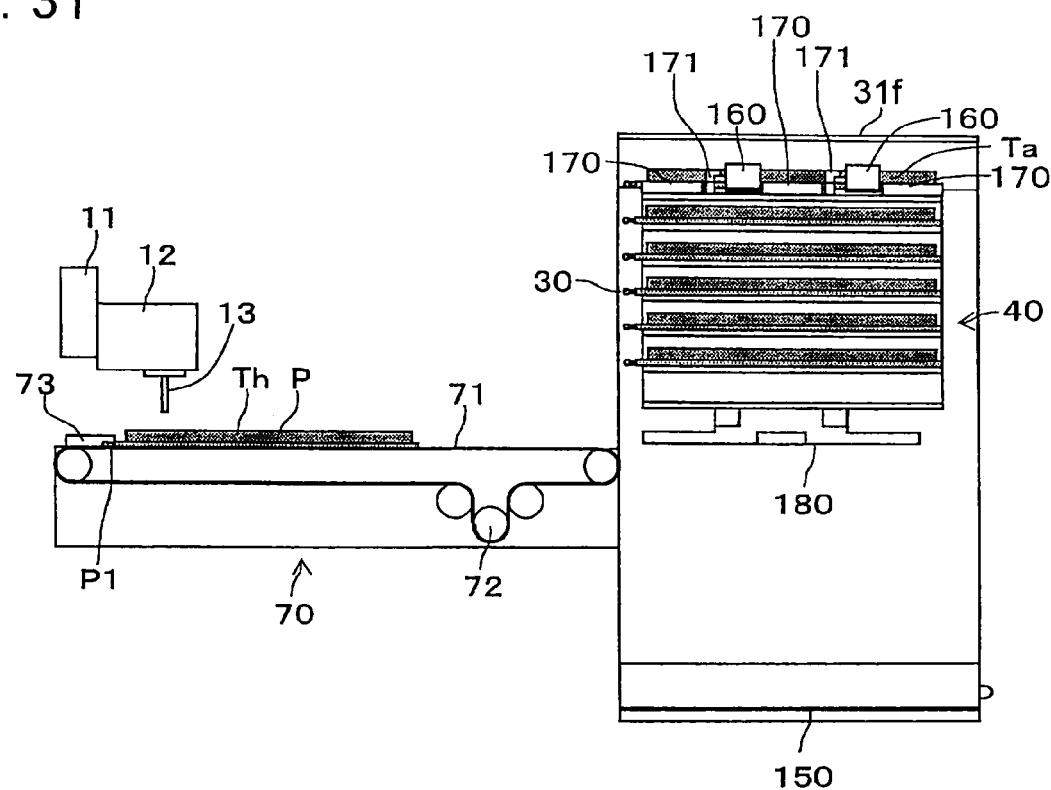
FIG. 31 is an explanatory view for explaining the operation of the tray component supply apparatus according to the present invention.

Subsequently, as shown in FIG. 31, the tray component supply apparatus 20 moves the tray stocker 40 upward with the empty tray Ta held thereby and fixedly positions the tray stocker 40 to a position (the elevated end position being the aforementioned transfer position) where the tray stocker side empty tray holding sections 170 come close to the main body side empty tray holding sections 160. At this time, the main body side empty tray holding sections 160 and the empty tray holding member moving means 171 operate cooperatively as mentioned earlier, whereby the main body side empty tray holding sections 160 and the tray stocker side empty tray holding sections 170 simultaneously hold the same empty tray Ta.

Figure 32:
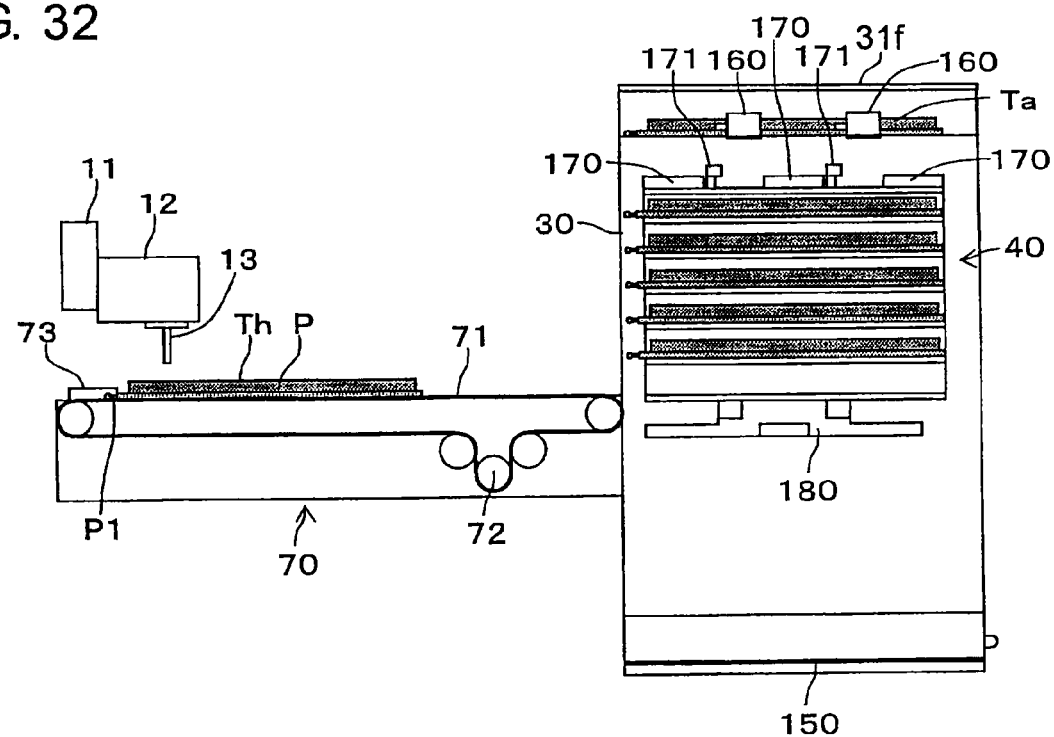
FIG. 32 is an explanatory view for explaining the operation of the tray component supply apparatus according to the present invention.

Next, as shown in FIG. 32, the tray component supply apparatus 20 moves the tray stocker 40 downward and fixedly positions the same to a position where a storage location for the pallet P being mounted on the tray mounting table 70 takes the same height as the tray mounting table 70. At this time, as the tray stocker 40 is moved down, the empty tray Ta held by the tray stocker side empty tray holding sections 170 is transferred to the main body side empty tray holding sections 160.

Figure 33:
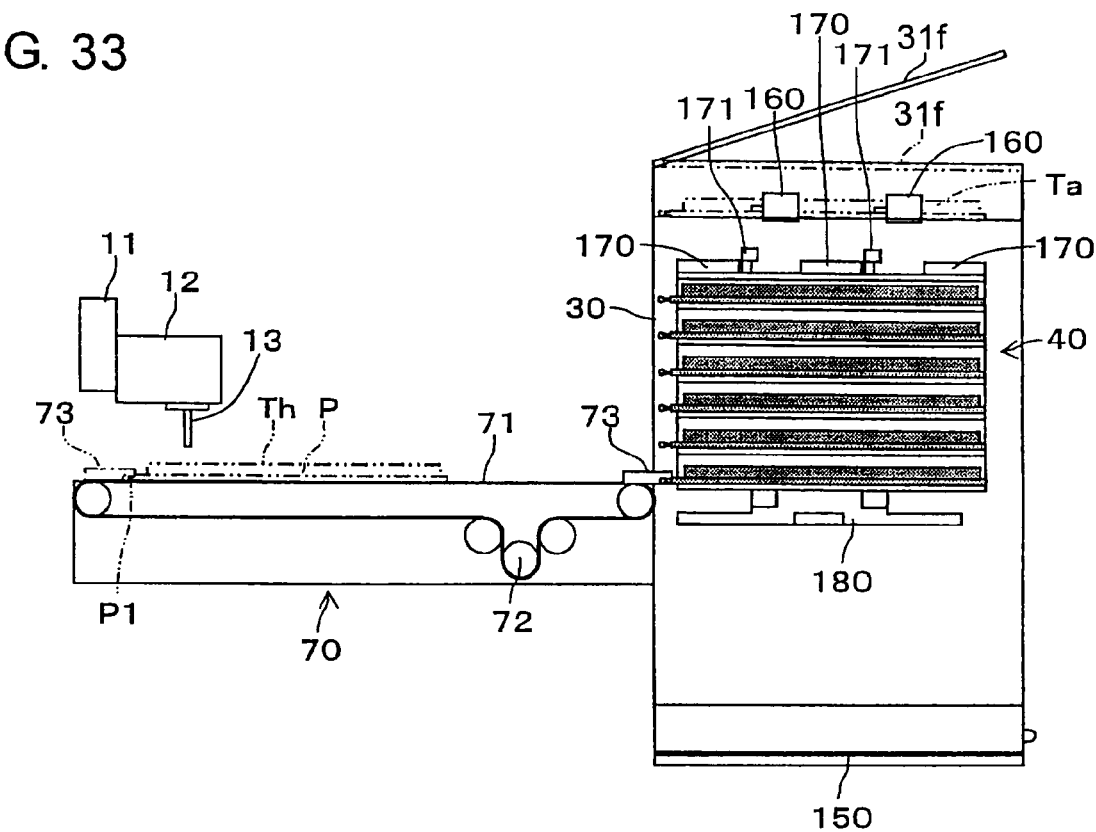
FIG. 33 is an explanatory view for explaining the operation of the tray component supply apparatus according to the present invention.

Then, as shown in FIG. 33, the tray component supply apparatus 20 moves the pallet coupling portion 73 on the tray mounting table 70 to the predetermined position in the main body 30 of the tray component supply apparatus 20 to store the component supply tray T at the location of the tray stocker 40 where it was. Further, the worker opens the top plate 31f of the main body 30, takes out the empty tray Ta held by the main body side empty tray holding sections 160, and close the top plate 31f. With this construction, since the empty tray Ta is taken out by opening the top plate 31f of the main body 30, one can easily take out the empty tray Ta. The aforementioned discharge of the empty tray Ta can be done without moving the tray stocker 40 up and down and without moving the component supply tray T on the tray mounting table 70 to and from the tray stocker 40.

Figure 25:
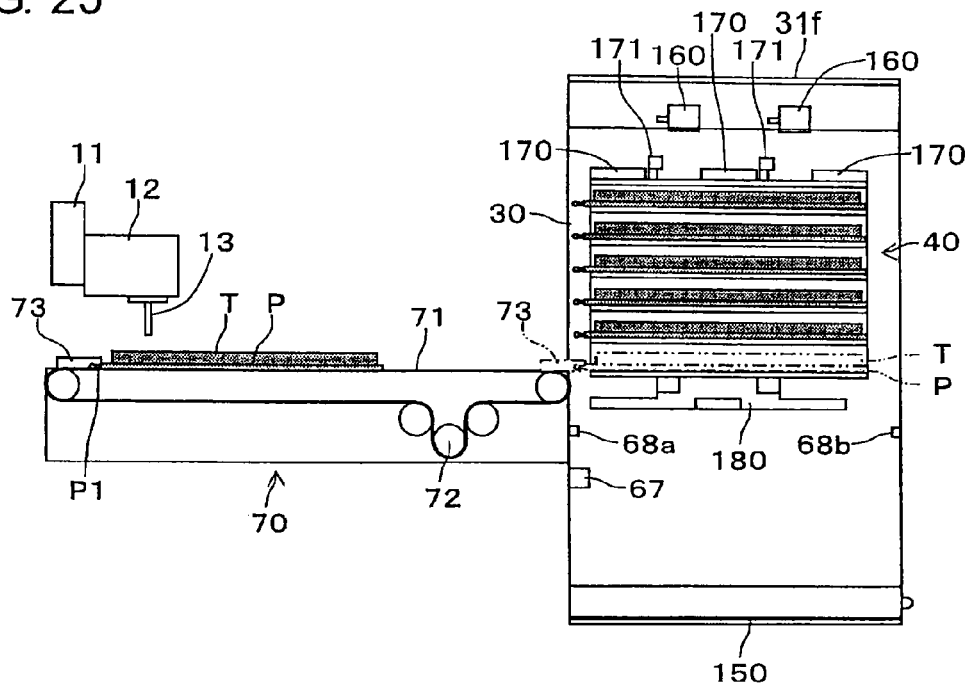
FIG. 25 is an explanatory view for explaining the operation of the tray component supply apparatus according to the present invention.
Figure 26:
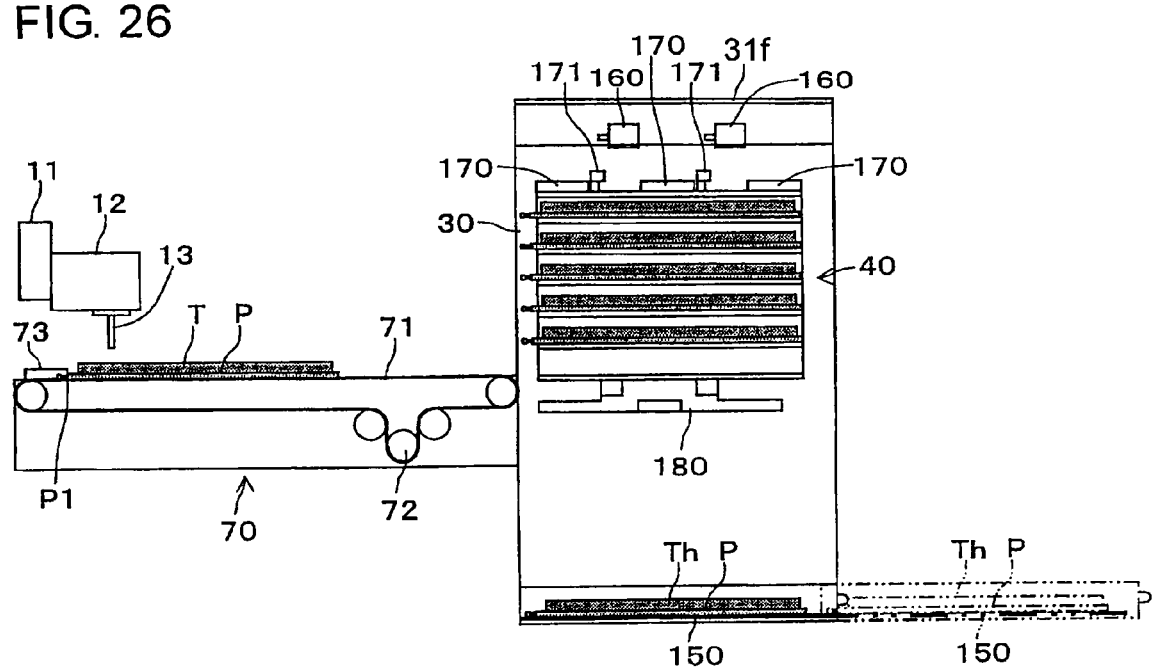
FIG. 26 is an explanatory view for explaining the operation of the tray component supply apparatus according to the present invention.

Further, as shown in FIG. 25, the tray component supply apparatus 20 is provided with a barcode reader 67 and a tray sensor 68. The barcode reader 67 is secured to the front inside of the main body 30 within an area which is lower than the hatch 31a1 and upper than the main body side replenishment tray holding section 150, and reads a barcode seal affixed to a front surface of an upright portion upwardly protruding from the front end of each pallet P, during the upward movement of the pallets P. The kinds of the components can be recognized as the result of such reading. For earlier recognition, the barcode reader 67 may be placed to be as low as possible within the aforementioned area. The tray sensor 68 is composed of transmitter and receiver sections 68a, 68b and detects information pertaining to the pallets P and the trays T which pass by the transmitter and receiver sections 68a, 68b, such as, for example, information on whether the tray T is loaded on each pallet P or not, the heights of the trays T and the like. If it is judged as a result of this detection that the replenishment tray is not proper for the reason that a wrong replenishment tray Th is held by the replenishment tray holding members 180 or that the replenishment tray Th held by the replenishment tray holding members 180 has wrong components loaded thereon, it can be done immediately to return the replenishment tray Th held by the replenishment tray holding members 180 to the main body side replenishment tray holding section 150.

As understood from the foregoing description, in this embodiment, since the replenishment tray Th can be replenished from the lower part of the main body 30, it can be realized to provide the tray component supply apparatus 20 which is made to be compact without enlarging the apparatus in the lateral direction. Further, since in replenishing the tall main body 30 with the replenishment tray Th, the replenishment tray Th is replenished to the main body side replenishment tray holding section 150 provided at the lower part of the main body 30, the replenishing can be done with good work efficiency. Further, it can be done to discharge the empty tray Ta from the upper part of the main body 30 by providing the main body side empty tray holding sections 160 which are capable of holding the empty tray Ta as well as of discharging the empty tray Ta out, at the upper part of the main body 30 and by causing the empty tray holding member moving means 171 to transfer the empty tray Ta held by the empty tray holding sections 170 to the main body side empty tray holding sections 160. Therefore, it is also possible to provide the tray component supply apparatus which is made to be compact without enlarging the apparatus in the lateral direction.

Although in each of the foregoing embodiments, description has been made regarding an example wherein the component supply trays T are laid flat, they may be piled up or may be mixed to be laid flat and to be piled up. Further, the height of the component supply tray or trays T mounted on the pallet P may be the height for one step of the tray stocker 40 (the height between one guide slot and the next) or may be the height for plural steps.

Further, although in each of the foregoing embodiments, it is arranged that the tray component supply apparatus 20 and hence, the electronic component mounting apparatus 10 are informed about the completion of the storage by the depression of the switch (not shown), a modification may be made to inform the tray component supply apparatus 20 and hence, the electronic component mounting apparatus 10 about the completion of the storage by making it possible to automatically detect that the main body side replenishment tray holding section 150 is returned into the main body 30 with the replenishment tray Th mounted thereon.

INDUSTRIAL APPLICABILITY

As described above, the tray component supply apparatus according to the present invention is suitable in designing the tray component supply apparatus to be compact.

The invention claimed is:

1. A tray component supply apparatus comprising:
a tray stocker provided inside an apparatus main body to be reciprocally movable in a vertical direction and configured to store plural component supply trays arranged therein in the vertical direction;
a tray stocker drive device for reciprocally moving the tray stocker in the vertical direction to selectively position the tray stocker to a number of predetermined positions including uppermost and lowermost end positions;
a tray drawing mechanism for horizontally drawing to a component delivery position a component supply tray stored in the tray stocker and positioned by the vertical movement of the tray stocker to a predetermined position between the uppermost and lowermost end positions;
a main body side replenishment tray holding section provided vertically stationarily at a part of the apparatus main body, the part being over or under the tray stocker for externally receiving and holding a replenishment tray which is a component supply tray loaded with components; and
a tray stocker side replenishment tray holding section provided at an upper or lower part of the tray stocker for vertical reciprocating movement together with the tray stocker, the tray stocker side replenishment tray holding section being capable of horizontally slidably holding the replenishment tray; and
wherein the replenishment tray held by the main body side replenishment tray holding section is transferred to the tray stocker side replenishment tray holding section when the tray stocker side replenishment tray holding section is positioned by the vertical movement of the tray stocker to the uppermost or lowermost end position close to the main body side replenishment tray holding section.

2. The tray component supply apparatus as set forth in claim 1, further comprising:
a table serving as a location for temporary turnout and protruding from the front of the apparatus main body in the horizontal direction for mounting a component supply tray on an upper surface thereof, so that the replenishment tray held by the tray stocker side replenishment tray holding section may be drawn onto the upper surface of the table and then stored in the tray stocker through movement of the tray stoker in the vertical direction and operation of the tray drawing mechanism.

3. The tray component supply apparatus as set forth in claim 2, wherein the component delivery position and the location for temporary turnout are at the same position on the table.

4. A tray component supply apparatus comprising:
a tray stocker provided inside an apparatus main body to be reciprocally movable in a vertical direction and configured to store plural component supply trays arranged therein in the vertical direction;
a tray stocker drive device for reciprocally moving the tray stocker in the vertical direction to selectively position the tray stocker to a number of predetermined positions including uppermost and lowermost end positions;
a tray drawing mechanism for horizontally drawing to a component delivery position a component supply tray stored in the tray stocker and positioned by the vertical movement of the tray stocker to a predetermined position between the uppermost and lowermost end positions;
a main body side replenishment tray holding section provided vertically stationarily at a part of the apparatus main body, the part being over or under the tray stocker for externally receiving and holding a replenishment tray which is a component supply tray loaded with components; and
a tray stocker side replenishment tray holding section provided at an upper or lower part of the tray stocker for vertical reciprocating movement together with the tray stocker, the tray stocker side replenishment tray holding section being capable of horizontally slidably holding the replenishment tray; and
a tray transfer mechanism for transferring the replenishment tray held by the main body side replenishment tray holding section to the tray stocker side replenishment tray holding section when the tray stocker side replenishment tray holding section is positioned by the vertical movement of the tray stocker to the uppermost or lowermost end position close to the main body side replenishment tray holding section.

5. A tray component supply apparatus comprising:
a tray stocker provided inside an apparatus main body to be reciprocally movable in a vertical direction and configured to store for storing plural component supply trays arranged therein in the vertical direction;
a tray stocker drive device for reciprocally moving the tray stocker in the vertical direction to selectively position the tray stocker to a number of predetermined positions including uppermost and lowermost end positions;
a tray drawing mechanism for horizontally drawing to a component delivery position a component supply tray stored in the tray stocker and positioned by the vertical movement of the tray stocker to a predetermined position between the uppermost and lowermost end positions;
a main body side replenishment tray holding section provided vertically stationarily at a part of the apparatus main body, the part being over the tray stocker for externally receiving and holding a replenishment tray which is a component supply tray loaded with components; and
a tray stocker side replenishment tray holding section provided at an upper surface of the tray stocker for vertical reciprocating movement together with the tray stocker, the tray stocker side replenishment tray holding section being capable of horizontally slidably holding the replenishment tray; and
a tray transfer mechanism for transferring the replenishment tray held by the main body side replenishment tray holding section to the tray stocker side replenishment tray holding section when the tray stocker side replenishment tray holding section is positioned by the vertical movement of the tray stocker to the uppermost end position close to the main body side replenishment tray holding section.

6. The tray component supply apparatus as set forth in claim 5, wherein the main body side replenishment tray holding section comprises a frame member formed to be rectangular and first replenishment tray holding members which are protruded from a pair of facing side plates of the frame member to be movable inward in the horizontal direction for holding the replenishment tray.

7. The tray component supply apparatus as set forth in claim 6, wherein the frame member is provided at an upper part of the apparatus main body to be drawable in the horizontal direction so that the replenishment tray is replenished with the frame member drawn out.

8. The tray component supply apparatus as set forth in claim 6, wherein the frame member is bodily provided at the upper part of the apparatus main body and wherein a top plate of the apparatus main body is constructed to be opened and closed so that the replenishment tray is replenished with the top plate opened.

9. A tray component supply apparatus comprising:
a tray stocker provided inside an apparatus main body to be reciprocally movable in a vertical direction and configured to store plural component supply trays arranged therein in the vertical direction;
a tray stocker drive device for reciprocally moving the tray stocker in the vertical direction to selectively position the tray stocker to a number of predetermined positions including uppermost and lowermost end positions;
a tray drawing mechanism for horizontally drawing to a component delivery position a component supply tray stored in the tray stocker and positioned by the vertical movement of the tray stocker to a predetermined position between the uppermost and lowermost end positions;
a main body side replenishment tray holding section provided vertically stationarily at a part of the apparatus main body, the part being under the tray stocker, for externally receiving and holding a replenishment tray which is a component supply tray loaded with components; and
a tray stocker side replenishment tray holding section provided at a lower part of the tray stocker for vertical reciprocating movement together with the tray stocker, the tray stocker side replenishment tray holding section being capable of horizontally slidably holding the replenishment tray; and wherein the replenishment tray held by the main body side replenishment tray holding section is transferred to the tray stocker side replenishment tray holding section when the tray stocker side replenishment tray holding section is positioned by the vertical movement of the tray stocker to the lowermost end position close to the main body side replenishment tray holding section.

10. The tray component supply apparatus as set forth in claim 9, wherein the tray stocker side replenishment tray holding section includes replenishment tray holding members movable between a holding position for slidably holding the replenishment tray and a holding release position for releasing the holding, and wherein the tray component supply apparatus further comprises a replenishment tray holding member moving mechanism for moving the replenishment tray holding members between the holding position and the holding release position to move the replenishment tray held by the main body side replenishment tray holding section to the replenishment tray holding members.

11. The tray component supply apparatus as set forth in claim 9, wherein the main body side replenishment tray holding section is constituted to be drawable in the horizontal direction so that the replenishment tray is replenished with the main body side replenishment tray holding section drawn out.

12. The tray component supply apparatus as set forth in claim 9, wherein the replenishment tray held by the tray stocker side replenishment tray holding section is stored at a predetermined location in the tray stocker after drawn out once to the component delivery position.

13. A tray component supply apparatus comprising:
a tray stocker provided inside an apparatus main body to be reciprocally movable in a vertical direction and configured to store plural component supply trays arranged therein in the vertical direction;
a tray stocker drive device for reciprocally moving the tray stocker in the vertical direction to selectively position the tray stocker to a number of predetermined positions including uppermost and lowermost end positions;
a tray drawing mechanism for horizontally drawing to a component delivery position a component supply tray stored in the tray stocker and positioned by the vertical movement of the tray stocker to a predetermined position between the uppermost and lowermost end positions;
a main body side empty tray holding section provided vertically stationarily at a part of the apparatus main body, the part being under or over the tray stocker, for holding an empty tray which is a component supply tray emptied of components and for discharging the empty tray; and
a tray stocker side empty tray holding section provided at a lower part or upper part of the tray stocker for vertical reciprocal movement together with the tray stocker, the tray stocker side empty tray holding section being capable of horizontally slidably holding the empty tray; and
wherein the empty tray held by the tray stocker side empty tray holding section is transferred to the main body side empty tray holding section when the tray stocker side empty tray holding section is positioned by the vertical movement of the tray stocker to the lowermost or uppermost end position close to the main body side empty tray holding section.

14. The tray component supply apparatus as set forth in claim 13, further comprising:
a table serving as a location for temporary turnout and protruding from the front of the apparatus main body in the horizontal direction for mounting an empty tray on an upper surface thereof, so that the empty tray on the upper surface of the table may be held by the tray stocker side empty tray holding section through movement of the tray stoker in the vertical direction and operation of the tray drawing mechanism.

15. The tray component supply apparatus as set forth in claim 14, wherein the component delivery position and the location for temporary turnout are at the same position on the table.

16. A tray component supply apparatus comprising:
a tray stocker provided inside an apparatus main body to be reciprocally movable in a vertical direction and configured to store plural component supply trays arranged therein in the vertical direction;
a tray stocker drive device for reciprocally moving the tray stocker in the vertical direction to selectively position the tray stocker to a number of predetermined positions including uppermost and lowermost end positions;
a tray drawing mechanism for horizontally drawing to a component delivery position a component supply tray stored in the tray stocker and positioned by the vertical movement of the tray stocker to a predetermined position between the uppermost and lowermost end positions;
wherein a main body side replenishment tray holding section for externally receiving and holding a replenishment tray which is a component supply tray loaded with components is provided at the uppermost end position on a moving locus of the tray stocker, while a tray discharge section for holding an empty tray which is a component supply tray emptied of components and for discharging the empty tray out is provided at the lowermost end position of the moving locus; and
wherein the tray stocker is provided at its upper end part with a tray stocker side replenishment tray holding section for receiving and holding the replenishment tray transferred from the main body side replenishment tray holding section and at its lower end part with empty tray holding members for holding the empty tray to be discharged to the tray discharge section.

* * * * *